(12) United States Patent
Wu

(10) Patent No.: US 12,368,097 B2
(45) Date of Patent: Jul. 22, 2025

(54) CONTACT STRUCTURES FOR REDUCING ELECTRICAL SHORTS AND METHODS OF FORMING THE SAME

(71) Applicant: Taiwan Semiconductor Manufacturing Company Limited, Hsinchu (TW)

(72) Inventor: Tung-Jiun Wu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 183 days.

(21) Appl. No.: 18/333,715

(22) Filed: Jun. 13, 2023

(65) Prior Publication Data

US 2023/0326849 A1    Oct. 12, 2023

Related U.S. Application Data

(62) Division of application No. 17/232,623, filed on Apr. 16, 2021, now Pat. No. 11,715,687.

(Continued)

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76816* (2013.01); *H01L 21/76831* (2013.01);
(Continued)

(58) Field of Classification Search
CPC ......... H01L 21/76897; H01L 21/76831; H01L 21/76832; H01L 21/76816; H01L 23/5226;
(Continued)

(56) References Cited

U.S. PATENT DOCUMENTS

2010/0044869 A1    2/2010    Zhang et al.
2013/0069234 A1    3/2013    Lee et al.
(Continued)

OTHER PUBLICATIONS

Chinese Patent Office; Application No. 202110587540.4; First Office Action mailed Jul. 7, 2023, 13 pages.
(Continued)

*Primary Examiner* — Zandra V Smith
*Assistant Examiner* — John M Parker
(74) *Attorney, Agent, or Firm* — The Marbury Law Group, PLLC

(57) ABSTRACT

A planarization dielectric layer is formed over the semiconductor device on a semiconductor substrate. A device contact via structure is formed through the planarization dielectric layer. A planar dielectric spacer liner is formed over the planarization dielectric layer, and is patterned to provide an opening over the device contact via structure. An etch stop dielectric liner and a via-level dielectric layer are formed over the planar dielectric spacer liner. An interconnect via cavity may be formed through the via-level dielectric layer by a first anisotropic etch process that may be selective to the etch stop dielectric liner, and may be subsequently extended by a second anisotropic etch process that etches the etch stop dielectric liner. An interconnect via structure may be formed in the interconnect via cavity. A bottom periphery of the interconnect via structure may be self-aligned to the opening in the planar dielectric spacer liner.

20 Claims, 15 Drawing Sheets

Related U.S. Application Data

(60) Provisional application No. 63/031,116, filed on May 28, 2020.

(51) Int. Cl.
*H01L 23/528* (2006.01)
*H01L 23/532* (2006.01)
*H10D 64/01* (2025.01)
*H10D 64/23* (2025.01)
*H10D 64/27* (2025.01)

(52) U.S. Cl.
CPC .... *H01L 21/76832* (2013.01); *H01L 23/5283* (2013.01); *H01L 23/53295* (2013.01); *H10D 64/01* (2025.01); *H10D 64/258* (2025.01); *H10D 64/514* (2025.01)

(58) Field of Classification Search
CPC ............... H01L 23/5283; H01L 29/401; H01L 29/41791; H10D 64/258; H10D 64/01; H10D 64/514
See application file for complete search history.

(56) References Cited

U.S. PATENT DOCUMENTS

| | | |
|---|---|---|
| 2016/0093566 A1 | 3/2016 | Ting et al. |
| 2018/0240704 A1 | 8/2018 | Ting et al. |
| 2019/0067341 A1* | 2/2019 | Li .................... H10D 86/0231 |
| 2020/0006083 A1 | 1/2020 | Huang et al. |
| 2022/0293512 A1 | 9/2022 | Lo et al. |

OTHER PUBLICATIONS

Taiwan Patent Office; Application No. 110116429; Office Action mailed Jun. 10, 2022, 9 pages.

\* cited by examiner

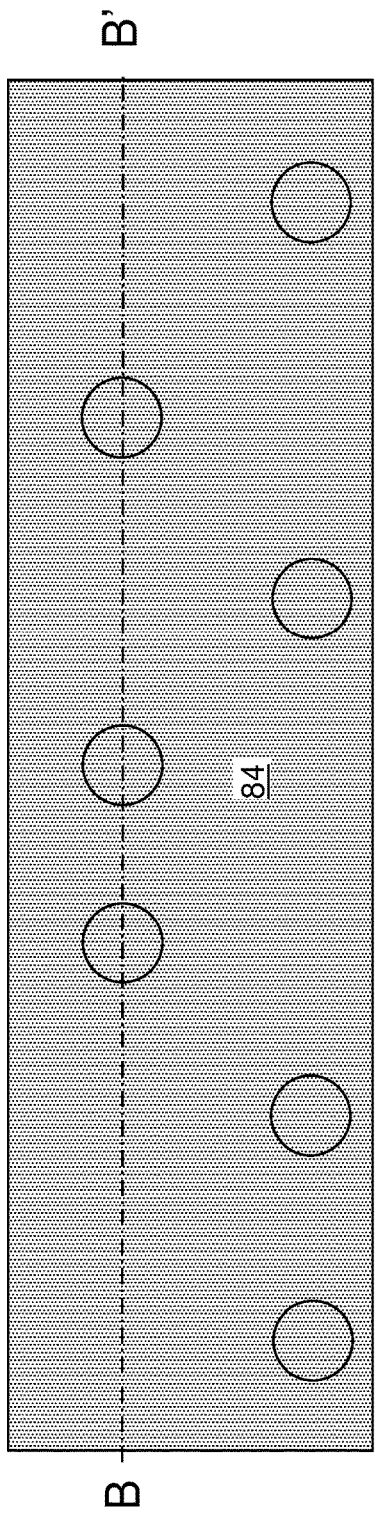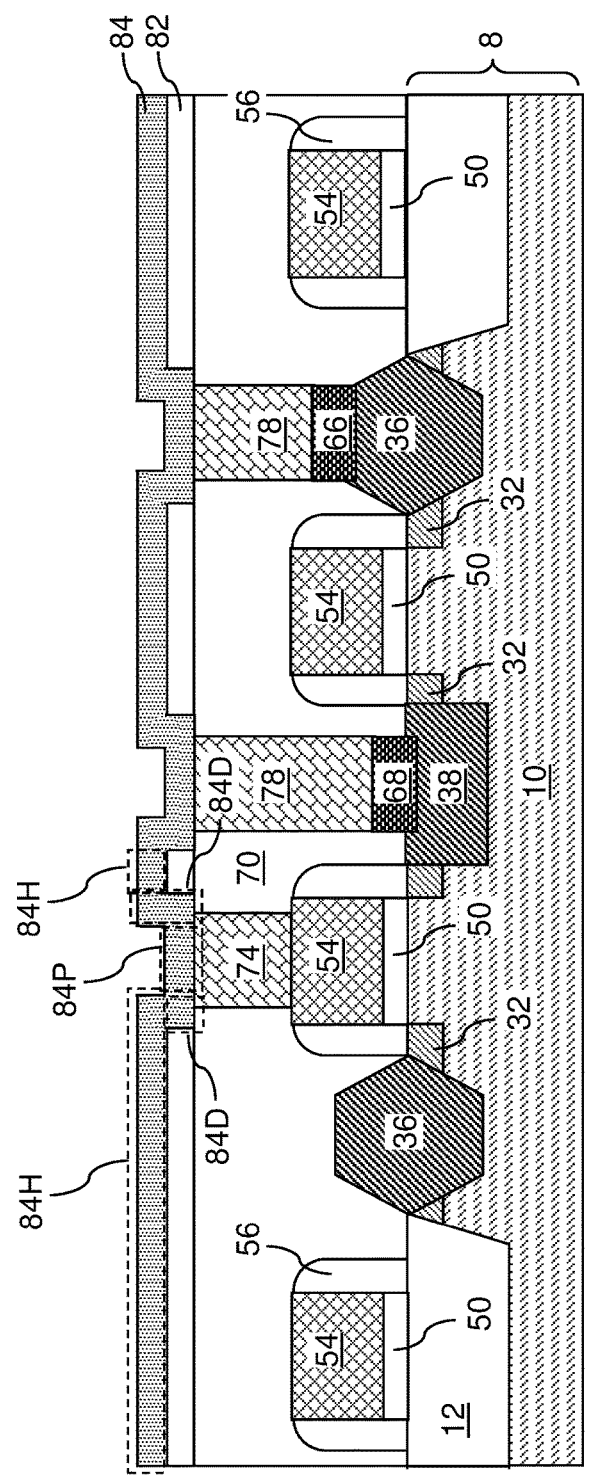
FIG. 8A
FIG. 8B

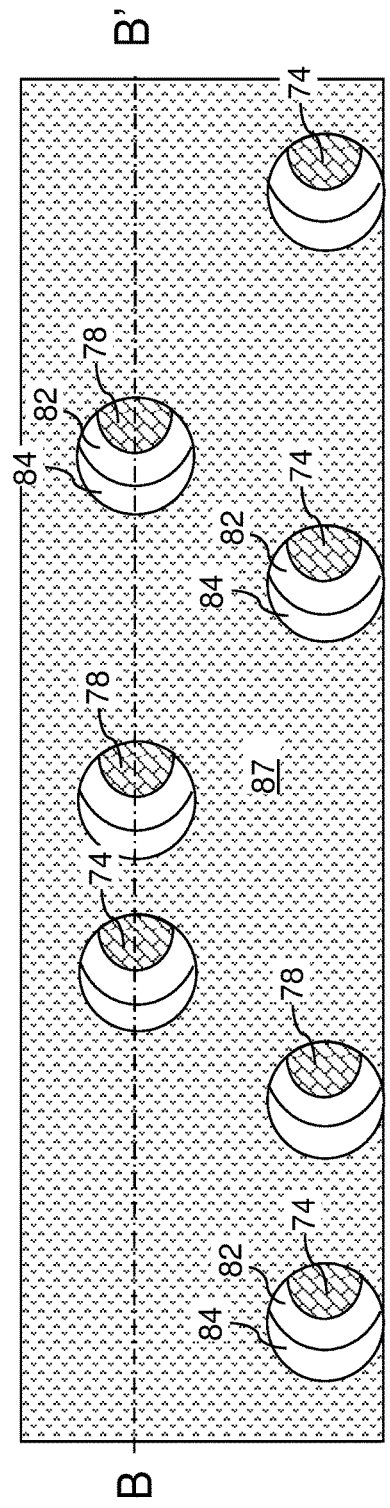
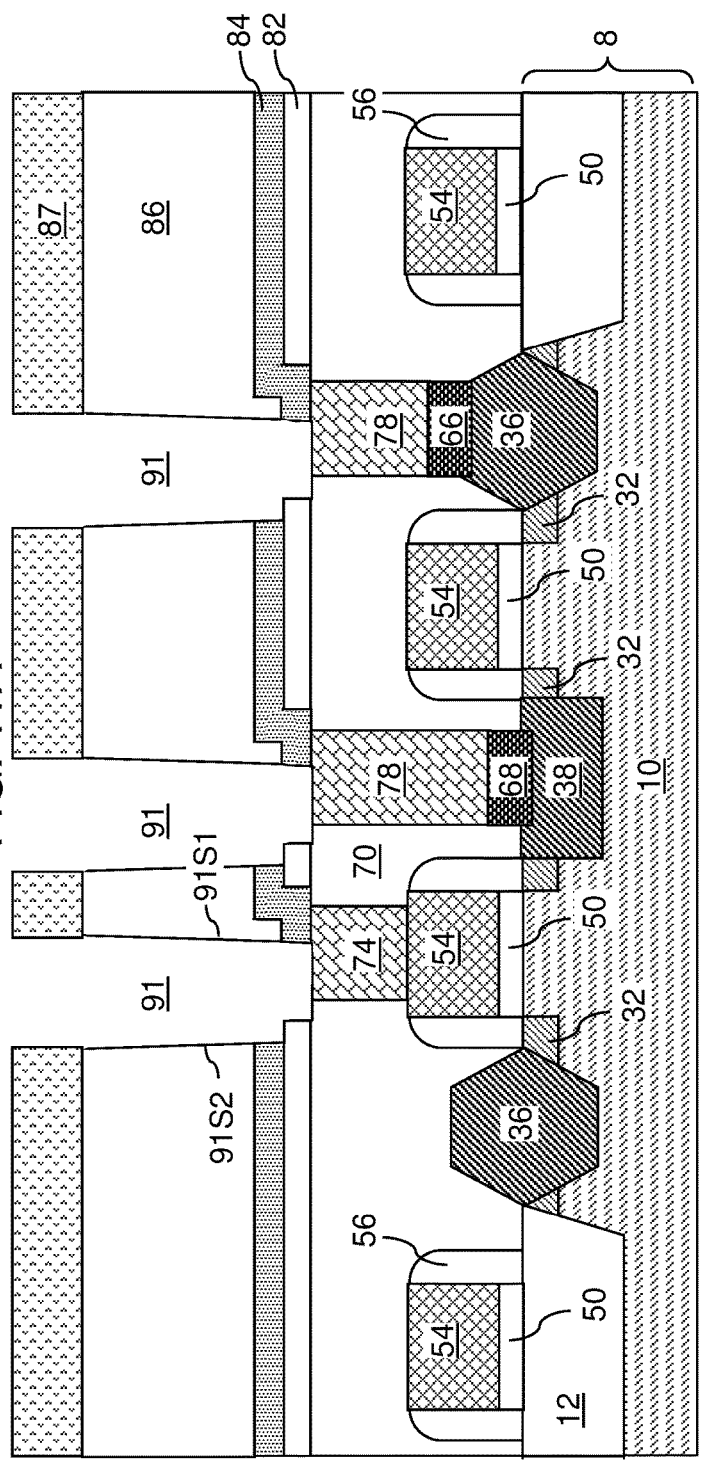
FIG. 11A
FIG. 11B

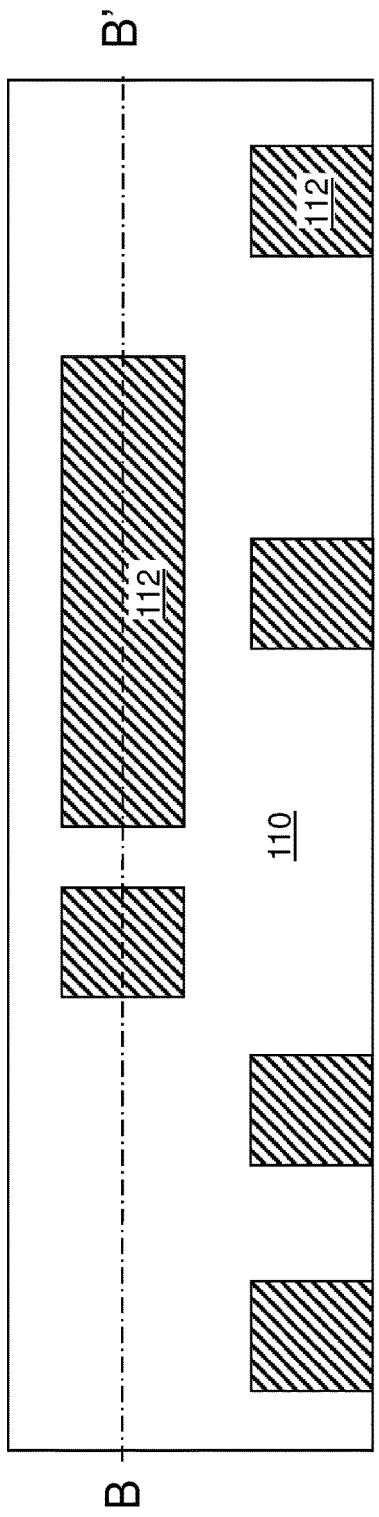
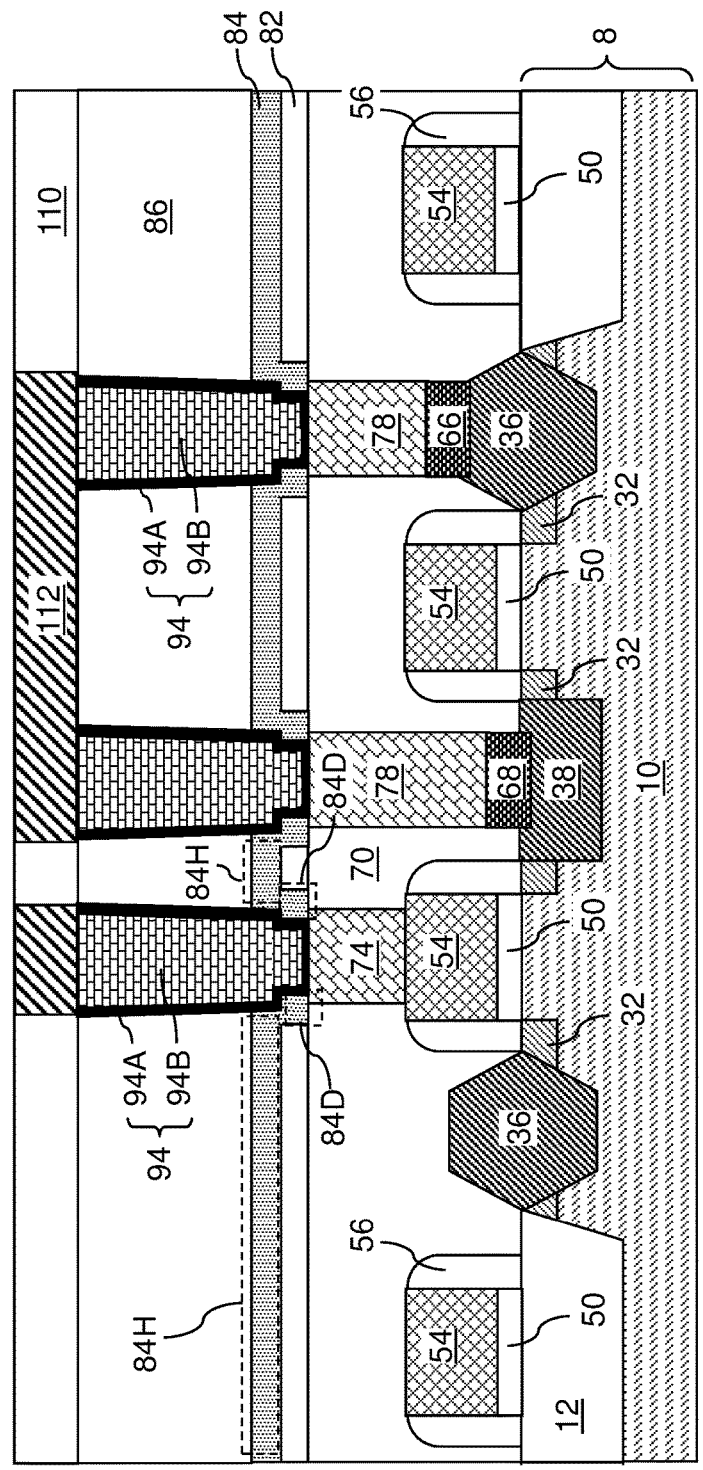
FIG. 14A
FIG. 14B

CONTACT STRUCTURES FOR REDUCING ELECTRICAL SHORTS AND METHODS OF FORMING THE SAME

RELATED APPLICATIONS

This application is a divisional application of U.S. application Ser. No. 17/232,623 entitled "Contact Structures for Reducing Electrical Shorts and Methods of Forming the Same," filed on Apr. 16, 2021, which claims priority to U.S. Provisional Patent Application No. 63/031,116 entitled "New MEOL VC Scheme to Avoid CD Overlap Cause Tiger Teeth Impact Space" filed on May 28, 2020, the entire contents of both of which are hereby incorporated by reference for all purposes.

BACKGROUND

High-density semiconductor devices require minimization of overlay-induced electrical shorts to provide high device yield during manufacturing and high reliability during usage. As device density increases the likelihood of unintentional electrical connection (i.e., shorts) also increases and the space between device decreases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8A is a top-down view of the exemplary structure after formation of an etch stop dielectric liner according to an embodiment of the present disclosure.

FIG. 8B is a vertical cross-sectional view of the exemplary structure along the plane B-B' of FIG. 8A.

FIG. 11A is a top-down view of the exemplary structure after extension of the interconnect via cavities through the etch stop dielectric liner according to an embodiment of the present disclosure.

FIG. 11B is a vertical cross-sectional view of the exemplary structure along the plane B-B' of FIG. 11A.

FIG. 14A is a top-down view of an alternative configuration of the exemplary structure according to an embodiment of the present disclosure.

FIG. 14B is a vertical cross-sectional view of the exemplary structure along the plane B-B' of FIG. 14A.

DETAILED DESCRIPTION

Figure 1A:
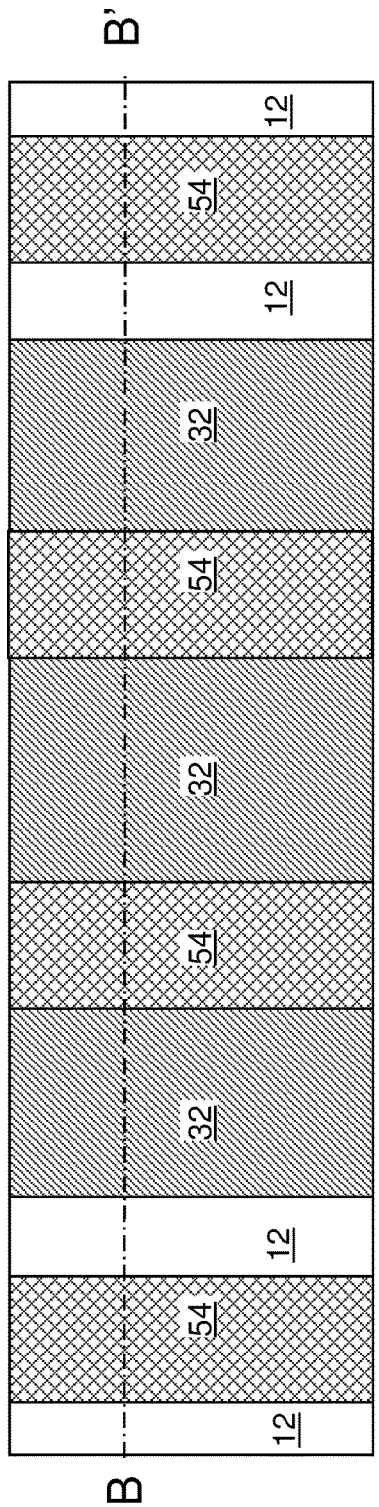
FIG. 1A is a top-down view of an exemplary structure after formation of shallow trench isolation structures, gate structures, and source/drain extension regions in an upper portion of a semiconductor substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

As device density increases the likelihood of unintentional electrical connection (i.e., shorts) also increases and the space between device decreases. In middle-end-of-the-line (MEOL) loop and back-end-of-the-line (BEOL) loop, a via opening may be formed in the interconnect dielectric (ILD) layer using photolithography and etching techniques. The via opening may then be filled with a conductive material. The conductive material may then be planarized. Accurate overlay between the via opening and the underlying conductive feature (i.e., source/drain electrode, gate electrode, etc. is important. Any inaccuracy or overlay deviations may cause the formation of a bridge and result in an unintended short circuit. In addition, an inaccuracy and/or overlay deviation may result in a via opening that may go deeper into the underlying ILD, and thus cause a "tiger tooth" condition. Tiger tooth may cause a voltage breakdown (VBD) failure. The tiger tooth condition may be more sever in instances where a thicker contact etch stop layer (CESL) (such as an etch stop dielectric liner) is used because process control for etching the thick CESL is difficult. For example, in instances where the CESL is 25 nm-35 nm.

The present disclosure is directed to generally to semiconductor devices, and specifically to semiconductor devices including contact structures configured to reduce electrical shorts between contact structures and methods of forming the same. For example, electrical shorts (i.e., unintended electrical connection between devices, contacts, electrodes, etc.) among device contact via structures and overlying interconnect via structures may be reduced by using a combination of a planar dielectric spacer liner including openings that may be aligned to underlying device contact via structures and a self-aligned etch stop dielectric liner that fits into the openings. Bottom portions of interconnect via cavities that are formed through an overlying via-level dielectric layer may be aligned to the openings in the planar dielectric spacer layer by using a first anisotropic etch process that is selective to the etch stop dielectric liner, and by using a second anisotropic etch process that etches the etch stop dielectric liner selective to the planar dielectric spacer liner. Various embodiments may include a method that uses a two-step etching and a structure to mitigate the bridge and tiger tooth issue in MEOL and BEOL fabrication. Various embodiments may include a tri-layered ILD. The tri-layered ILD may include $O_x$—SiN—$O_x$. The Ox may be replaced with other dielectric materials. The tri-layered ILD may mitigate tiger tooth issues. The various aspects of the present disclosure are now described in detail with reference to accompanying drawings.

Figure 1B:
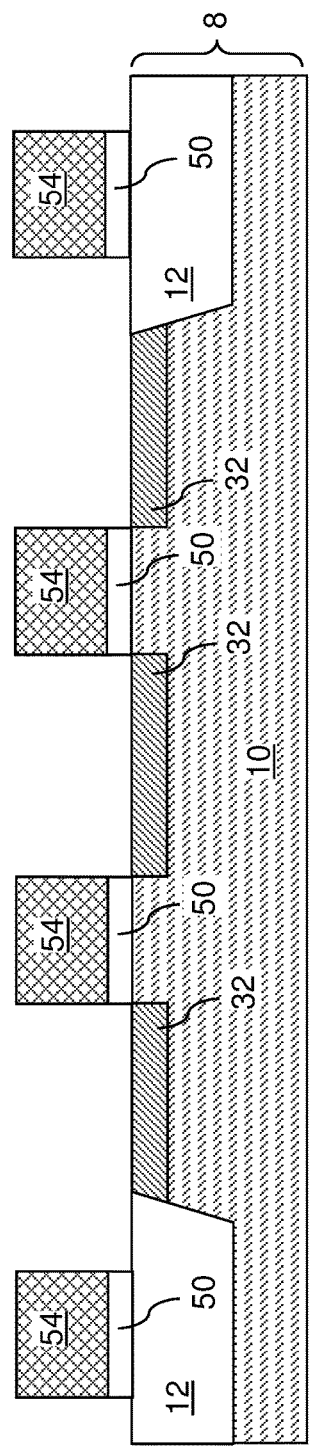
FIG. 1B is a vertical cross-sectional view of the exemplary structure along the plane B-B' of FIG. 1A.

Referring to FIGS. 1A and 1B, an exemplary structure according to an embodiment of the present disclosure includes a substrate 8, which may be a semiconductor substrate including a semiconductor material layer 10 at least in an upper portion thereof. The substrate 8 may include a commercially available bulk substrate such as a single crystalline bulk silicon substrate, or may include a commercially available semiconductor-on-insulator (SOI) substrate such as a silicon-on-insulator substrate including a single crystalline top silicon layer. The semiconductor material layer 10 may have a p-type doping or n-type doping. Various portions of the semiconductor material layer 10 may be suitably formed to provide doped well structures.

Shallow trench isolation structures 12 may be formed in an upper portion of the semiconductor material layer 10, for example, by forming shallow trenches and filling the shallow trenches with at least one dielectric fill material such as silicon oxide. Excess portions of the dielectric fill material may be removed from above the horizontal plane including the top surface of the substrate 8 by performing a planarization process such as a chemical mechanical planarization (CMP) process. Remaining portions of the dielectric fill material constitute the shallow trench isolation structures 12. The shallow trench isolation structures 12 may laterally surround discrete areas in which a top surface of the semiconductor material layer 10 may be physically exposed. Each such area is herein referred to as a device area. In other words, each device area is laterally surrounded by a respective portion of the shallow trench isolation structures 12.

Suitable semiconductor devices may be formed over the top surface of the substrate 8 in the device areas. The various semiconductor devices that may be formed over the substrate 8 include field effect transistors, junction transistors, diodes, capacitors, resistors, inductors, and various other semiconductor devices known in the art. In embodiments in which field effect transistors may be formed, the field effect transistors may include planar field effect transistors, vertical field effect transistors, fin field effect transistors, wrapped gate field effect transistors, or any type of field effect transistors known in the art. While the present disclosure is described using an embodiment in which field effect transistors are illustrates as exemplary semiconductor devices, embodiments are expressly contemplated herein in which the semiconductor devices formed on the substrate 8 may be any type of semiconductor devices known in the art on which at least one device contact via structure may be formed. A device contact via structure refers to a via structure that directly contacts a node of a semiconductor device.

In one embodiment, a gate dielectric layer and a gate electrode material layer may be deposited over the substrate 8, and may be patterned by a combination of lithographic patterning methods and an anisotropic etch process. Each contiguous patterned portion of the gate dielectric layer and the gate electrode material layer comprises a gate stack (50, 54), which includes a gate dielectric 50 and a gate electrode 54. Each gate dielectric 50 is a patterned portion of the gate dielectric layer, and each gate electrode 54 is a patterned portion of the gate electrode material layer.

In one embodiment, top portions of the semiconductor material layer 10 may be suitably doped by implanting electrical dopants, which may be p-type dopants or n-type dopants. For example, if a portion of the semiconductor material layer 10 that underlies a gate stack (50, 54) has a doping of a first conductivity type (which may be p-type or n-type), dopants of a second conductivity type may be implanted into surface portions of the semiconductor material layer 10 to form source/drain extension regions 32. A subset of the source/drain extension regions 32 may be source extension regions, and a subset of the source/drain extension regions 32 may be drain extension regions. The second conductivity type may be the opposite of the first conductivity type. For example, if the first conductivity type is p-type, the second conductivity type is n-type, and vice versa.

Figure 2A:
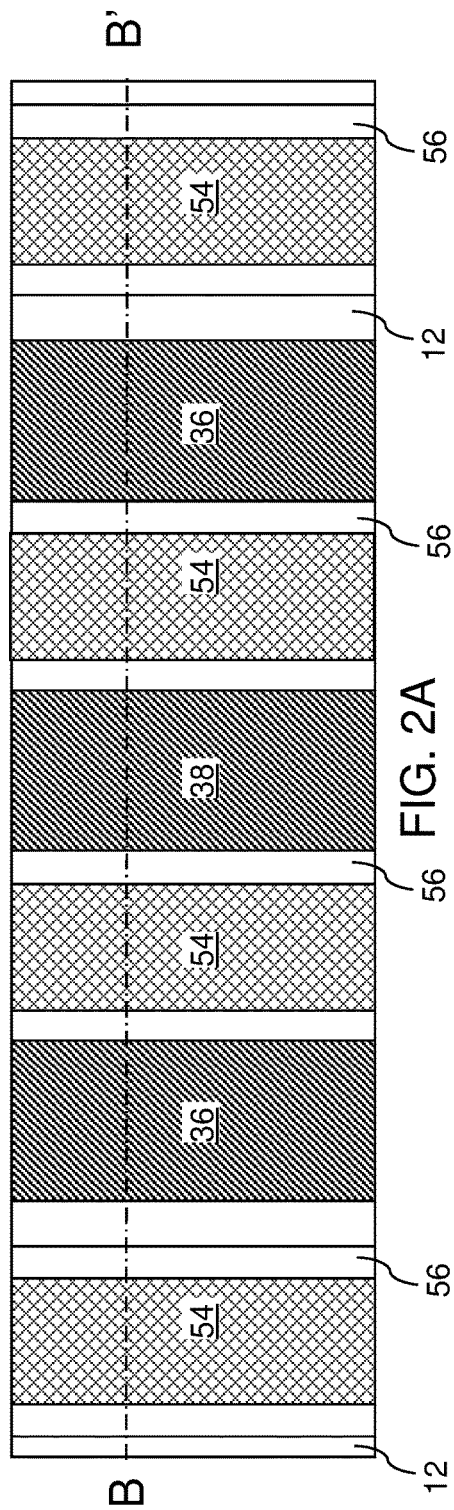
FIG. 2A is a top-down view of the exemplary structure after formation of gate spacers and source/drain regions according to an embodiment of the present disclosure.
Figure 2B:
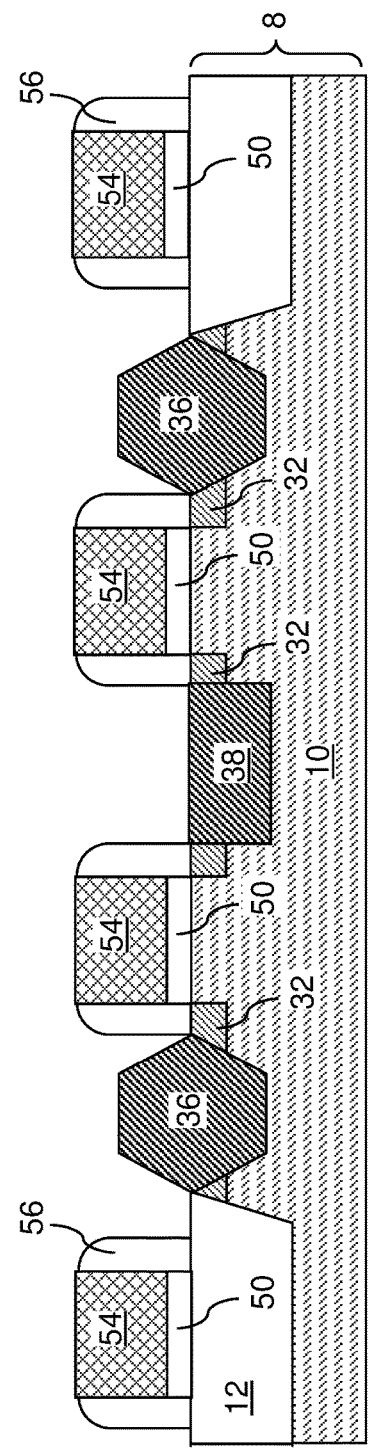
FIG. 2B is a vertical cross-sectional view of the exemplary structure along the plane B-B' of FIG. 2A.

Referring to FIGS. 2A and 2B, various additional components of semiconductor devices may be formed on, or in, the semiconductor material layer 10. In embodiments in which the semiconductor devices include field effect transistors, dielectric gate spacers 56 may be formed by conformal deposition of a dielectric spacer material layer and a subsequent anisotropic etch process that removes horizontal portions of the dielectric spacer material layer. Each remaining vertical portion of the dielectric spacer material layer comprises a dielectric gate spacer 56 that laterally surrounds a respective gate stack (50, 54). Source/drain regions (38, 36) may be formed by implantation of dopants (such as dopants of the second conductivity type) or by a selective epitaxy process that deposits a doped semiconductor material (such as doped semiconductor material having a doping of the second conductivity type). The source/drain regions (38, 36) may include planar source/drain regions 38 that are formed by ion implantation of dopants into surface portions of the semiconductor material layer 10 and/or the source/drain extension regions 32. Alternatively or additionally, the source/drain regions (38, 36) may include raised source/drain regions 36 that are formed by selective epitaxy of a doped semiconductor material and protrude above the horizontal plane including the top surface of the semiconductor material layer 10. In some embodiment, the raised source/drain regions 36 may be formed with faceted surfaces. In some embodiments, a recess etch process may be performed to form recesses adjacent to channel regions after formation of the dielectric gate spacers 56 and prior to the selective epitaxy process that forms the raised source/drain regions 36. In this embodiment, a lower portion of the raised source/drain regions 36 may be formed within the semiconductor material layer 10. The source/drain regions (38, 36) include source regions and drain regions for the field effect transistors. Generally, suitable processing steps may be performed to complete fabrication of the various semiconductor devices.

Figure 3A:
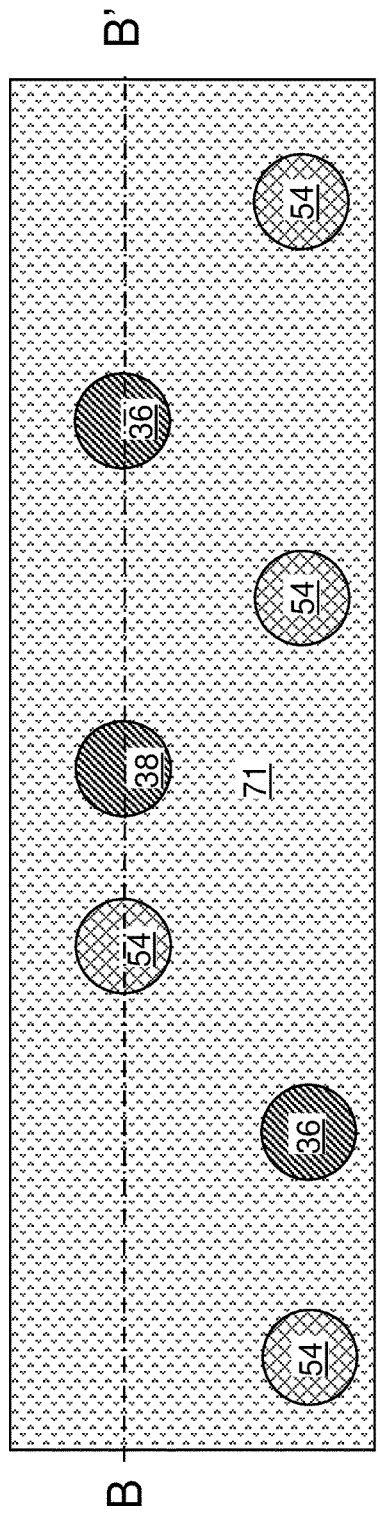
FIG. 3A is a top-down view of the exemplary structure after formation of a planarization dielectric layer and various contact via cavities according to an embodiment of the present disclosure.
Figure 3B:
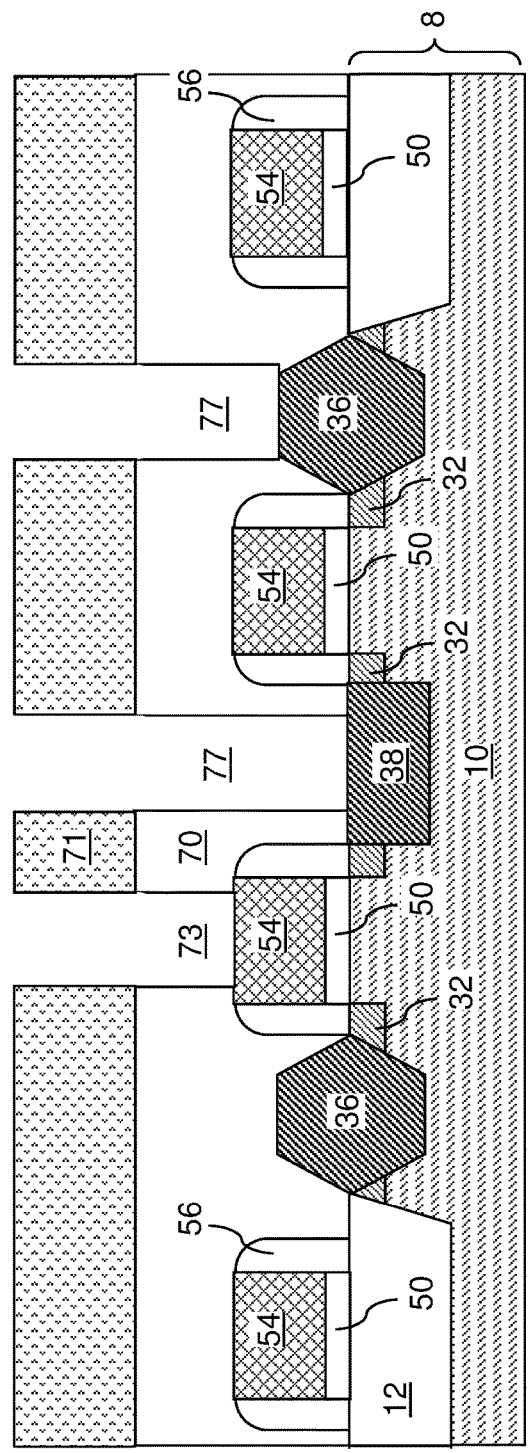
FIG. 3B is a vertical cross-sectional view of the exemplary structure along the plane B-B' of FIG. 3A.

Referring to FIGS. 3A and 3B, a planarization dielectric layer 70 may be formed over the various semiconductor devices. The planarization dielectric layer 70 may comprise, and/or may consist essentially of, at least one respective material that may be used as an interlayer dielectric (ILD) material. In one embodiment, the planarization dielectric layer 70 may comprise, and/or may consist essentially of, at least one dielectric material selected from undoped silicate glass, a doped silicate glass, an organosilicate glass, and a porous dielectric material having a dielectric constant less than 2.7 (which is commonly known as a low-k dielectric material). Other suitable materials are within the contemplated scope of disclosure. The top surface of the planarization dielectric layer 70 may be self-planarizing (in embodiments in which a spin-on process is used) or may be planarized by a planarization process (such as a chemical mechanical planarization process). The top surface of the planarization dielectric layer 70 may be raised above the highest surfaces of the semiconductor devices (which may be, for example, the top surfaces of the gate stacks (50, 54)), or may be coplanar with the highest surfaces of the semiconductor devices. In an illustrative example, the vertical distance between the top surface of the planarization dielectric layer 70 and the top surface of the semiconductor material layer 10 may be in a range from 200 nm to 1,000 nm, although lesser and greater vertical distances may also be used.

A photoresist layer 71 may be applied over the planarization dielectric layer 70, and may be lithographically patterned to form openings within areas in which device contact via structures are to be subsequently formed. Generally, the device contact via structures may be formed within the area of a respective node of the underlying semiconductor devices. In an illustrative example, in embodiments in which the underlying semiconductor devices include field effect transistors, the openings in the photoresist layer 71 may be formed within the areas of the source/drain regions (38, 36) and the gate electrodes 54. An anisotropic etch process may be performed to transfer the pattern of openings in the photoresist layer 71 through the planarization dielectric layer 70. The anisotropic etch process may etch the material of the planarization dielectric layer 70 selective to the materials of the various underlying nodes of the semiconductor devices (such as the materials of the source/drain regions (38, 36) and the gate electrodes 54).

Various contact via cavities (73, 77) may be formed through the planarization dielectric layer 70. For example, the contact via cavities (73, 77) may include gate contact via cavities 73 overlying a respective gate electrode 54, and source/drain contact via cavities 77 overlying a respective source/drain region (38, 36). Generally, a top surface of a node of a semiconductor device may be physically exposed at the bottom of each contact via cavity (73, 77). Each contact via cavity (73, 77) may have a respective straight sidewall that vertically extends from the top surface of the planarization dielectric layer 70 to a top surface of a respective node of the semiconductor devices. The photoresist layer 71 may be subsequently removed, for example, by ashing.

Figure 4A:
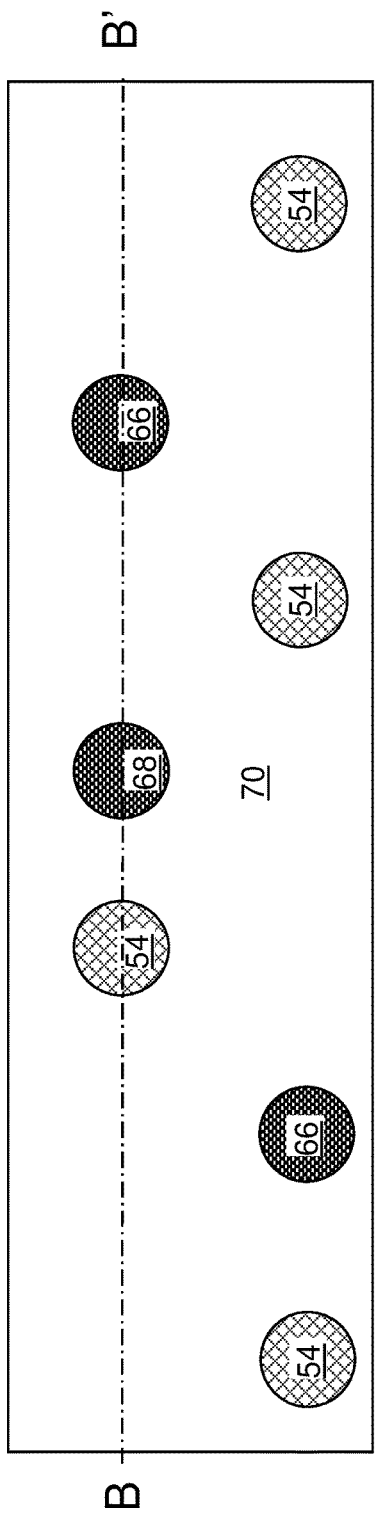
FIG. 4A is a top-down view of the exemplary structure after formation of metal semiconductor alloy regions according to an embodiment of the present disclosure.
Figure 4B:
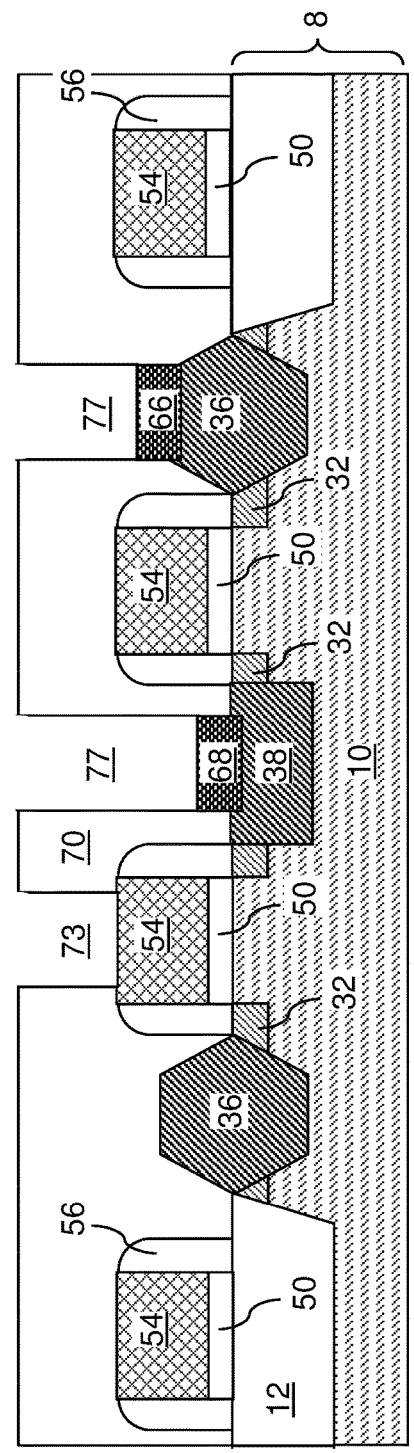
FIG. 4B is a vertical cross-sectional view of the exemplary structure along the plane B-B' of FIG. 4A.

Referring to FIGS. 4A and 4B, metal-semiconductor alloy regions (68, 66) may be optionally formed. For example, a metal that forms a metal-semiconductor alloy with the semiconductor material of the semiconductor material layer may be conformally deposited in the contact via cavities (73, 77) and over the planarization dielectric layer 70. If the semiconductor material layer 10 includes silicon or germanium, the deposited metal may be a metal that forms a metal silicide or a metal germanide. For example, the metal may include tungsten, cobalt, titanium, nickel, platinum, or combinations or mixtures thereof. Other suitable materials are within the contemplated scope of disclosure. A thermal anneal process may be performed to induce reaction between the deposited metal and underlying semiconductor material portions (such as surface portions of the source/drain regions (38 36)), thereby forming the metal-semiconductor alloy regions (68, 66). The elevated temperature of the thermal anneal process may be selected depending on the metal, and may be in a range from 500 degrees Celsius to 800 degrees Celsius, although lower and higher temperatures may also be used. Unreacted portions of the metal may be removed by performing a wet etch process that removes the metal selective to the metal-semiconductor alloy regions (68, 66). The metal-semiconductor alloy regions (68, 66) may include planar metal-semiconductor alloy regions 68 that are formed on the planar source/drain regions 38 and raised metal-semiconductor alloy regions 66 that are formed on the raised source/drain regions 36. In embodiments in which the gate electrodes 54 include a doped semiconductor material, a gate metal-semiconductor alloy region may be formed on top of each gate electrode 54. In embodiments in which the gate electrodes 54 include a metallic material, metal-semiconductor alloy regions are not formed on top of the gate electrodes 54.

Figure 5A:
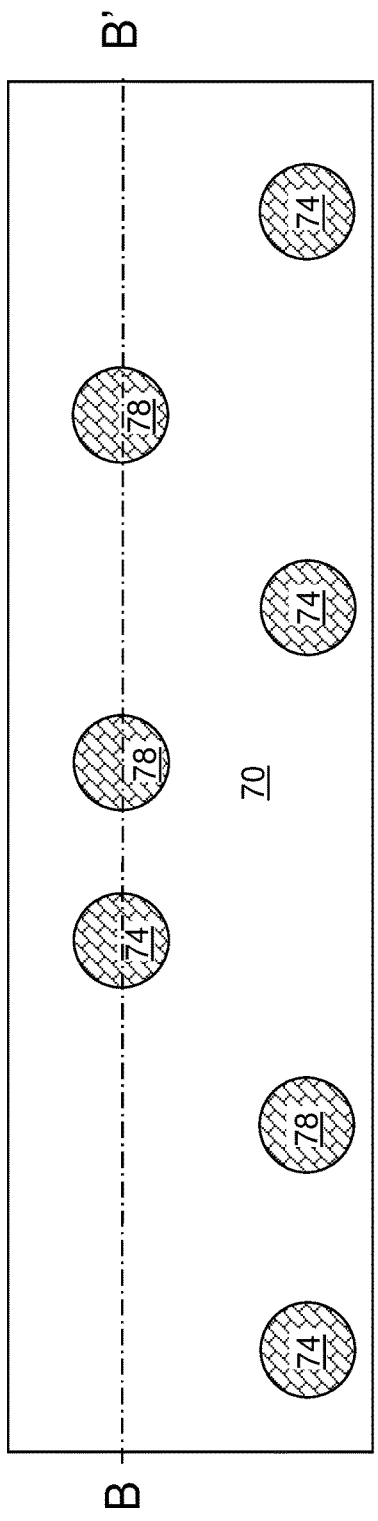
FIG. 5A is a top-down view of the exemplary structure after formation of device contact via structures according to an embodiment of the present disclosure.
Figure 5B:
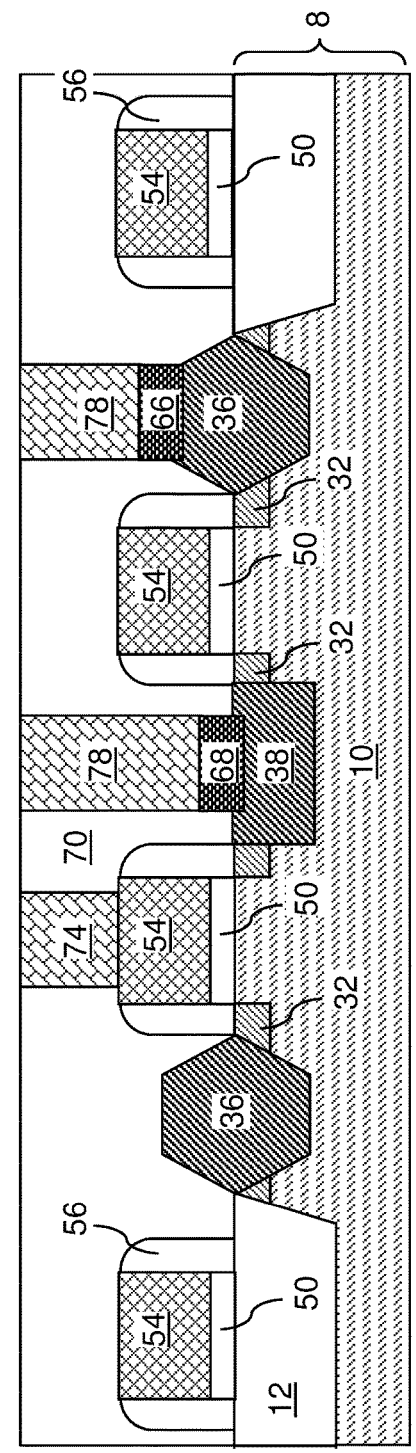
FIG. 5B is a vertical cross-sectional view of the exemplary structure along the plane B-B' of FIG. 5A.

Referring to FIGS. 5A and 5B, at least one conductive material may be deposited in the contact via cavities (73, 77). The at least one conductive material may include at least one metallic material. For example, a combination of a metallic nitride liner including TiN, TaN, and/or WN and a metallic fill material layer including W, Cu, Co, Ru, Mo, or combinations thereof may be deposited in the contact via cavities. Other suitable metallic fill materials are within the contemplated scope of disclosure. Alternatively, a heavily doped semiconductor material such as doped polysilicon may be deposited in the contact via cavities (73, 77). Excess portions of the at least one conductive material may be removed from above the horizontal plane including the top surface of the planarization dielectric layer 70. For example, a recess etch process and/or a chemical mechanical planarization may be performed to remove the portions of the at least one conductive material from above the horizontal plane including the top surface of the planarization dielectric layer 70. Each remaining portion of the at least one conductive material filling a contact via cavity (73, 77) constitutes a device contact via structure (74, 78).

Each device contact via structure (74, 78) may contact a node of an underlying semiconductor device. In an illustrative example, the device contact via structures (74, 78) may include gate contact via structures 74 that contact a gate electrode 54 or a gate metal-semiconductor alloy region (if present), and source/drain contact via structures 78 that contact a source/drain region (38, 36) or a metal-semiconductor alloy region (68, 66) that contacts an underlying source/drain region (38, 36). Each node of the semiconductor devices that are contacted by the device contact via structures (74, 78) may be a conductive element of the semiconductor devices. Each device contact via structure (74, 78) may have at least one straight sidewall that vertically extends from the top surface of the planarization dielectric layer 70 to a top surface of the element that constitutes the node of an underlying semiconductor device. In one embodiment, a device contact via structure (74, 78) may have a cylindrical sidewall. In one embodiment, one or more, or all, of the device contact via structures (74, 78) may have a respective circular, elliptical, or oval horizontal cross-sectional shape.

Figure 6A:
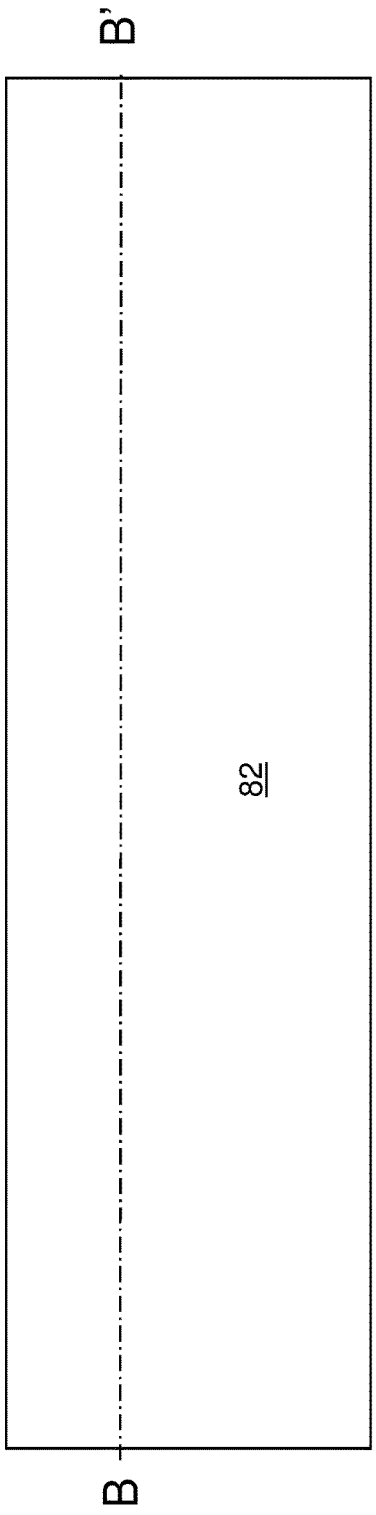
FIG. 6A is a top-down view of the exemplary structure after formation of a planar dielectric spacer liner according to an embodiment of the present disclosure.
Figure 6B:
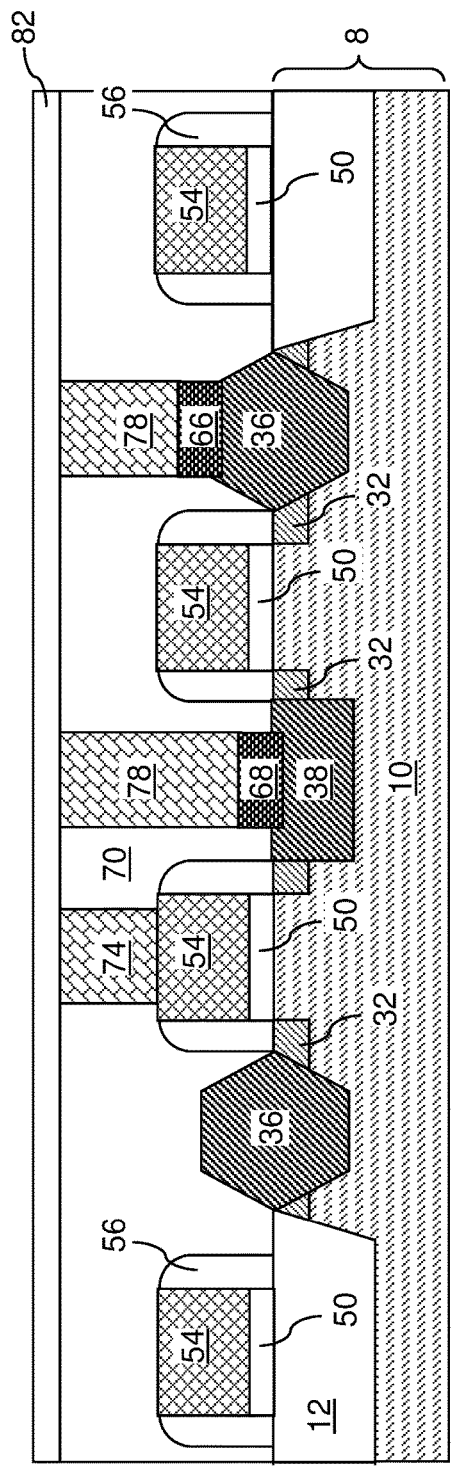
FIG. 6B is a vertical cross-sectional view of the exemplary structure along the plane B-B' of FIG. 6A.

Referring to FIGS. 6A and 6B, a planar dielectric spacer liner 82 including a first dielectric material may be deposited over the top surface of the planarization dielectric layer 70. The planar dielectric spacer liner 82 includes, or consists essentially of, the first dielectric material, which may be selected from silicon oxide, silicon oxynitride, and silicon carbide nitride. The planar dielectric spacer liner 82 may be deposited by a conformal or non-conformal deposition process. For example, the planar dielectric spacer liner 82 may be deposited by chemical vapor deposition. The planar dielectric spacer liner 82 may have a thickness in a range from 3 nm to 15 nm, such as from 5 nm to 10 nm, although lesser and greater thicknesses may also be used. The entirety of the top surface of the planar dielectric spacer liner 82 and the entirety of the bottom surface of the planar dielectric spacer liner 82 may be planar, i.e., may be located within a respective Euclidean plane.

Figure 7A:
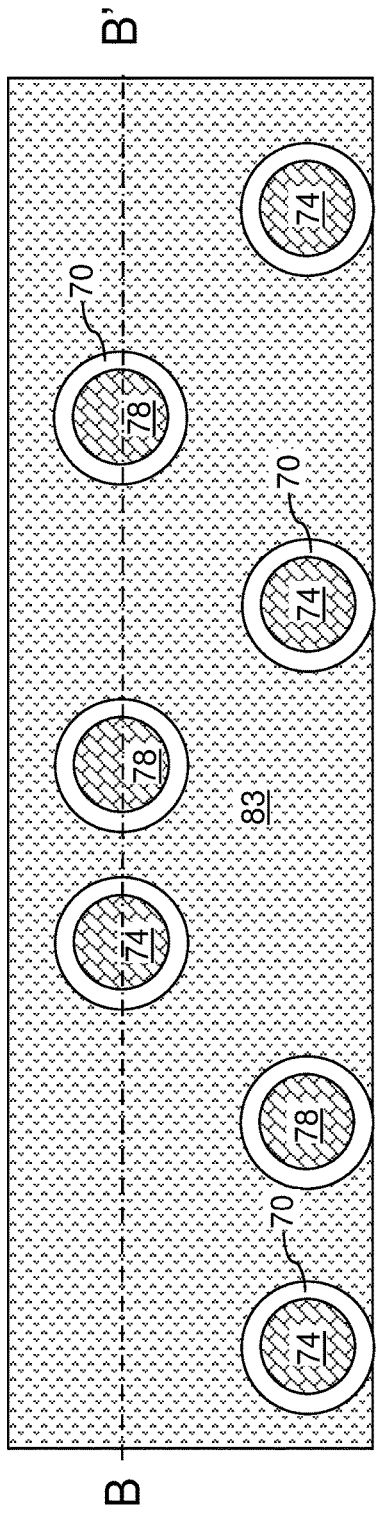
FIG. 7A is a top-down view of the exemplary structure after formation of openings through the planar dielectric spacer liner according to an embodiment of the present disclosure.
Figure 7B:
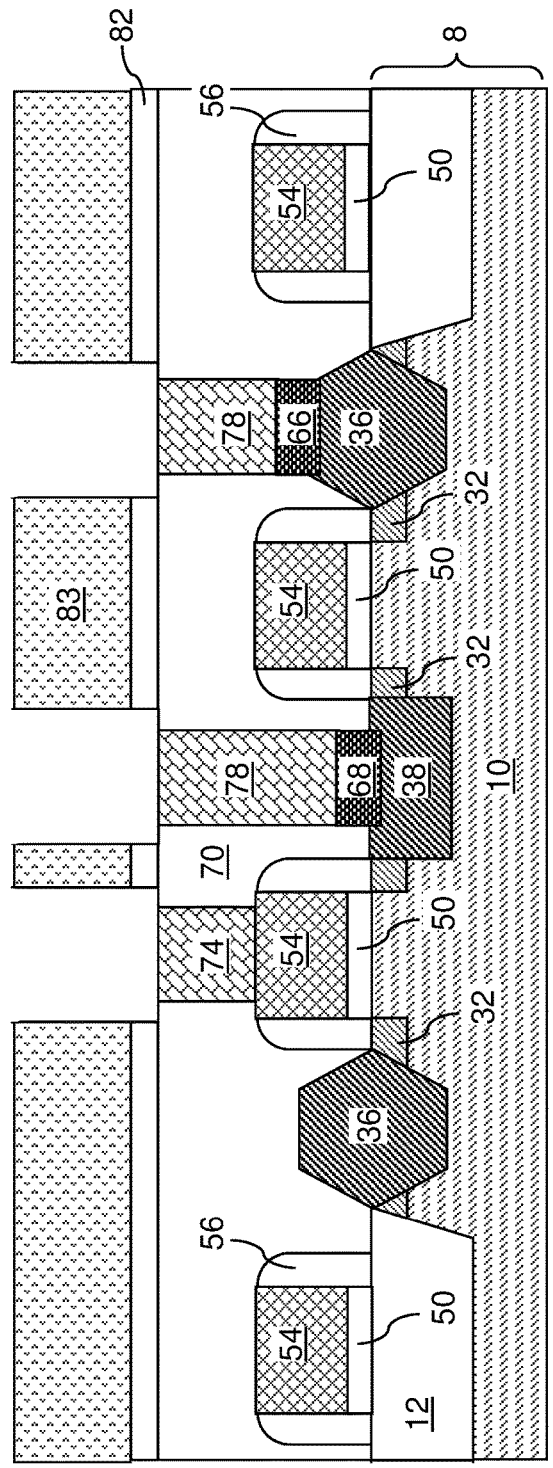
FIG. 7B is a vertical cross-sectional view of the exemplary structure along the plane B-B' of FIG. 7A.

Referring to FIGS. 7A and 7B, a photoresist layer 83 may be applied over the top surface of the planar dielectric spacer liner 82, and may be lithographically patterned to form openings within each area that overlies the device contact via structures (74, 78). The pattern of the openings in the photoresist layer 83 may be transferred through the planar dielectric spacer liner 82 by an etch process, which may include an anisotropic etch process (such as a reactive ion etch process) or an isotropic etch process (such as a chemical dry etch process or a wet etch process). In one embodiment, an anisotropic etch process may be performed to etch through unmasked portions of the planar dielectric spacer liner 82. In this embodiment, sidewalls of the openings through the planar dielectric spacer liner 82 may be vertical or substantially vertical. The area of each opening through the planar dielectric spacer liner 82 overlaps with the area of a respective underlying device contact via structure (74, 78). As such, a top surface of a device contact via structure (74, 78) may be physically exposed within each opening through the planar dielectric spacer liner 82. A periphery of a top surface of an underlying device contact via structure (74, 78) may be located entirely within a periphery of an overlying opening in the planar dielectric spacer liner 82, may be located entirely outside a periphery of an overlying opening in the planar dielectric spacer liner 82, or may intersect and/or overlap with a periphery of an overlying opening in the planar dielectric spacer liner 82. The photoresist layer 83 may be subsequently removed, for example, by ashing.

Referring to FIGS. 8A and 8B, an etch stop dielectric liner 84 including a second dielectric material may be conformally deposited over the planar dielectric spacer liner 82. The etch stop dielectric liner 84 includes, and/or consists essentially of, the second dielectric material. The second dielectric material is different from the dielectric materials of the planar dielectric spacer liner 82 and an upper portion of the planarization dielectric layer 70. Specifically, the etch stop dielectric liner 84 includes a dielectric material that may be anisotropically etched selective to the materials of the dielectric materials of the planar dielectric spacer liner 82 and an upper portion of the planarization dielectric layer 70. In one embodiment, the etch stop dielectric liner 84 comprises, and/or consists essentially of, a dielectric material selected from silicon nitride and a dielectric metal oxide (such as aluminum oxide, hafnium oxide, zirconium oxide, yttrium oxide, lanthanum oxide, titanium oxide, etc.) The etch stop dielectric liner 84 may be deposited by a conformal deposition process such as chemical vapor deposition or atomic layer deposition. The thickness of the etch stop dielectric liner 84 may be in a range from 5 nm to 20 nm, such as from 8 nm to 12 nm, although lesser and greater thicknesses may also be used. Generally, the thickness of the etch stop dielectric liner 84 is less than one half of the diameter or a semiminor axis of the horizontal cross-sectional shape of each opening through the planar dielectric spacer liner 82.

The etch stop dielectric liner 84 is deposited after removal of the photoresist layer 83 on the top surface of the planar dielectric spacer liner 82, and on a sidewall of each opening through the planar dielectric spacer liner 82. The etch stop dielectric liner 84 includes a horizontally-extending portion 84H that overlies the planar dielectric spacer liner 82, downward-protruding portions 84D (which may be cylindrical portions), and horizontal plate portions 84P. Each downward-protruding portion 84D (which may be cylindrical portions) may be located at a periphery of a respective opening through the planar dielectric spacer liner 82 and may be adjoined to the horizontally-extending portion 84H of the etch stop dielectric liner 84. Each horizontal plate portion 84P adjoins, and may laterally surrounded by, a respective downward-protruding portion 84D and maybe formed directly on, and thus contacts, a top surface of a respective underlying device contact via structure (74, 78). The etch stop dielectric liner 84 comprises recess regions that provide recessed horizontal surfaces. The recess regions of the etch stop dielectric liner 84 overlie the area of a respective device contact via structure (74, 78). A recessed planar top surface of the etch stop dielectric liner 84 in each recess region is vertically recessed relative to the horizontal plane including the topmost planar surface of the etch stop dielectric liner 84.

Figure 9A:
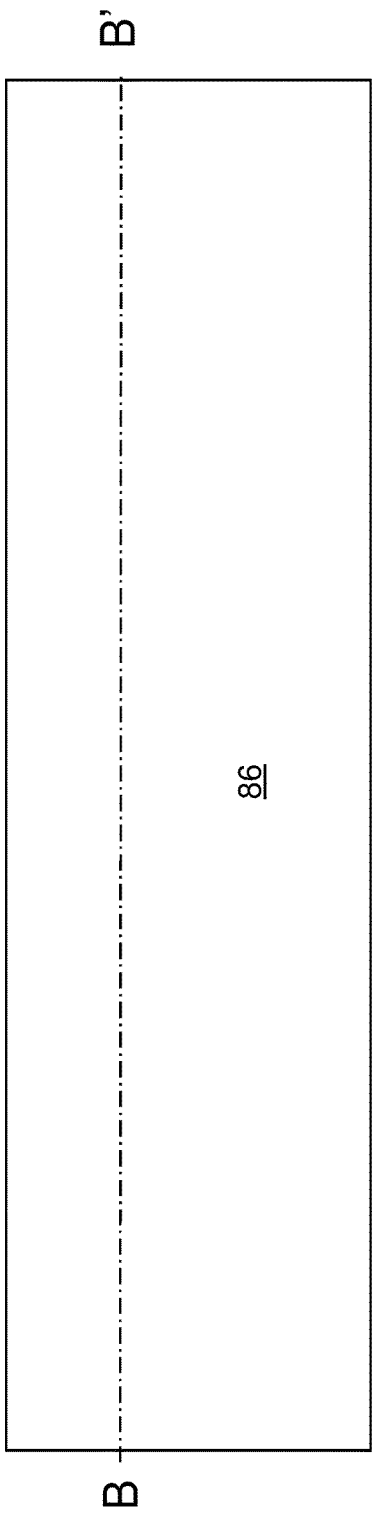
FIG. 9A is a top-down view of the exemplary structure after formation of a via-level dielectric layer according to an embodiment of the present disclosure.
Figure 9B:
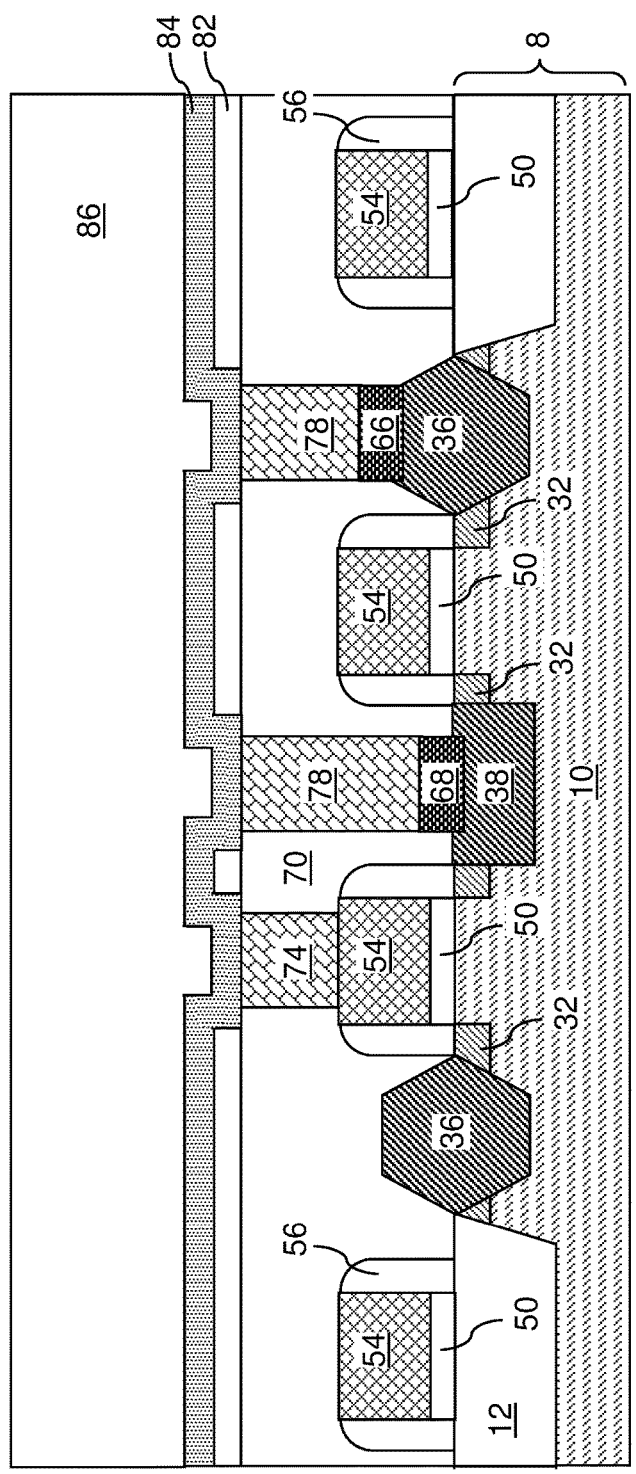
FIG. 9B is a vertical cross-sectional view of the exemplary structure along the plane B-B' of FIG. 9A.

Referring to FIGS. 9A and 9B, a via-level dielectric layer 86 including a third dielectric material may be deposited over the etch stop dielectric liner 84. The via-level dielectric layer 86 includes, and/or consists essentially of, the third dielectric material. The third dielectric material is different from the second dielectric material of the etch stop dielectric liner 84. For example, the via-level dielectric layer 86 may comprise, and/or may consist essentially of, at least one material selected from undoped silicate glass, a doped silicate glass, an organosilicate glass, and a porous dielectric material having a dielectric constant less than 2.7. The via-level dielectric layer 86 may have a planar horizontal top surface. The via-level dielectric layer 86 may be deposited by a conformal or non-conformal deposition process. For example, the via-level dielectric layer 86 may be deposited by a conformal deposition process such as a chemical vapor deposition process. The thickness of the via-level dielectric layer 86, as measured from the topmost surface of the etch stop dielectric liner 84, may be in a range from 100 nm to 1,000 nm, such as from 200 nm to 500 nm, although lesser and greater thicknesses may also be used. The planar dielectric spacer liner 82, etch stop dielectric liner 84, and via-level dielectric layer 86 may form a tri-layer ILD.

Figure 10A:
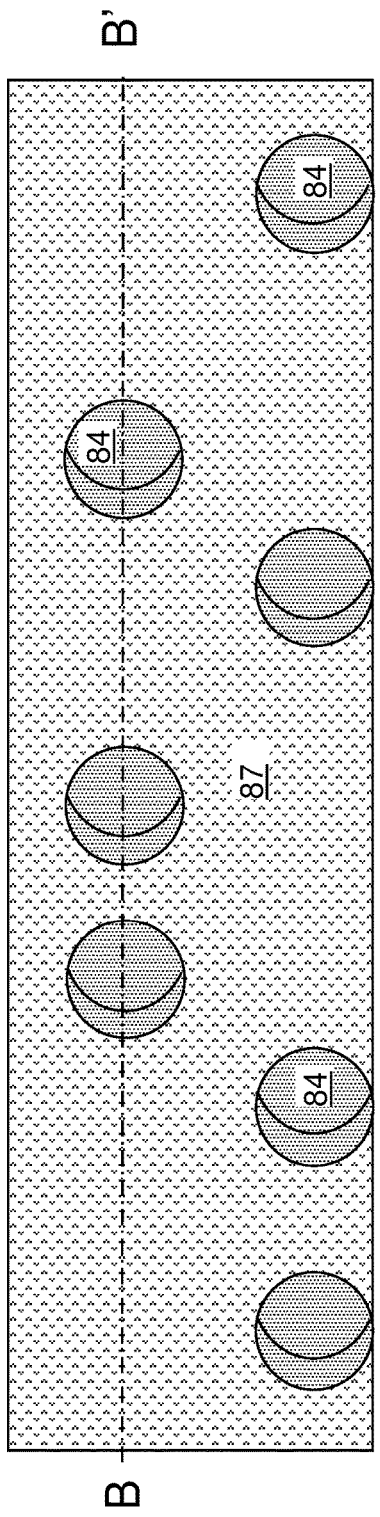
FIG. 10A is a top-down view of the exemplary structure after formation of interconnect via cavities through the via-level dielectric layer according to an embodiment of the present disclosure.
Figure 10B:
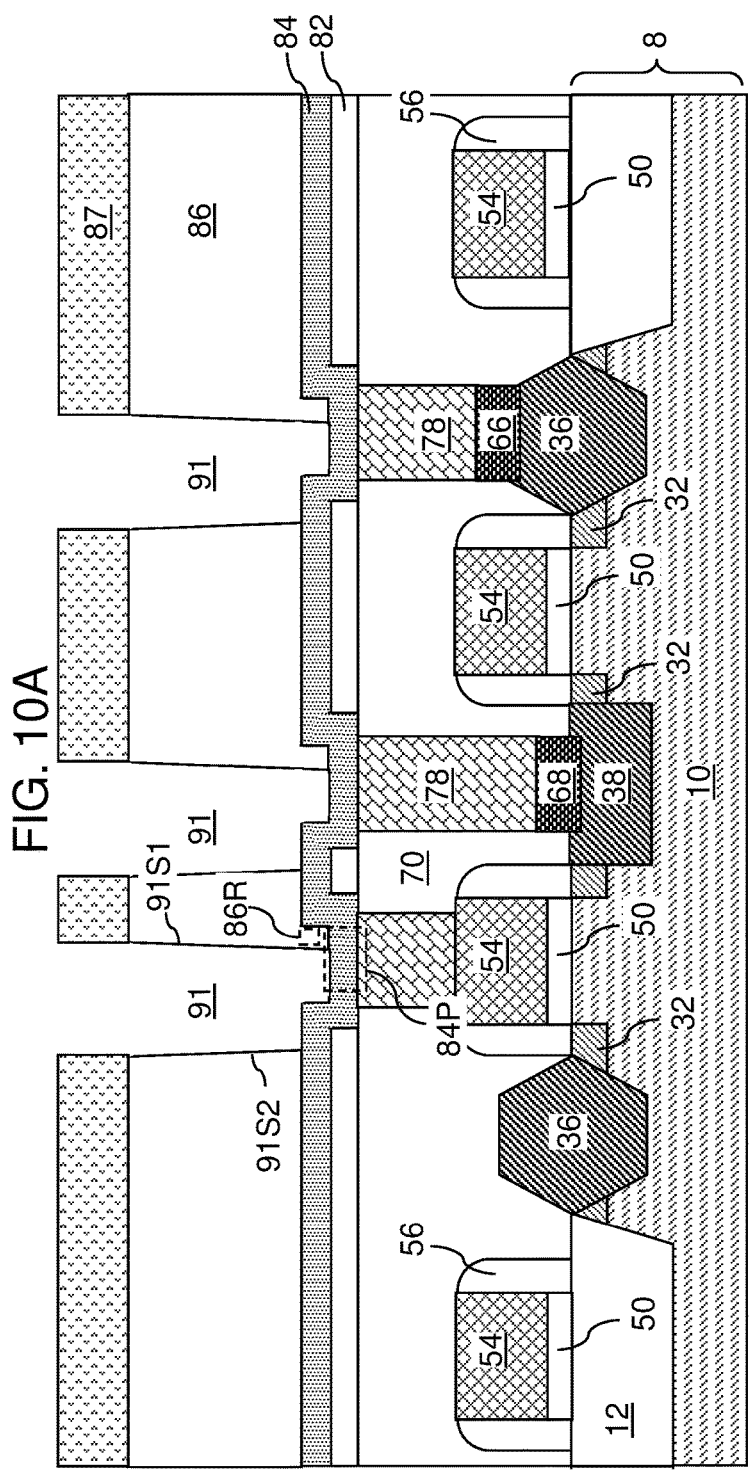
FIG. 10B is a vertical cross-sectional view of the exemplary structure along the plane B-B' of FIG. 10A.

Referring to FIGS. 10A and 10B, a photoresist layer 87 may be applied over the via-level dielectric layer 86, and may be lithographically patterned to form openings therein. In one embodiment, the pattern of the openings in the photoresist layer 87 may be the same as the pattern of the openings in the planar dielectric spacer liner 82 with, or without, optional scaling in the size of the openings in the photoresist layer 87. The change in the size of the openings in the photoresist layer 87 relative to the size of the openings in the planar dielectric spacer liner 82 may be due to intentional or unintentional critical dimension (CD) variations during the lithographic process that patterns the photoresist layer 87, and/or may be due to intentional enlargement or reduction in the size of the openings in the photoresist layer 87 during the lithographic patterning process that patterns the photoresist layer 87 and/or due to use of a lithographic mask having enlarged or reduced openings in a lithographic development tool.

A first anisotropic etch process may be performed to transfer the pattern of the openings in the photoresist layer 87 through the via-level dielectric layer 86. Interconnect via cavities 91 may be formed through the via-level dielectric layer 86 over the areas of the opening in the planar dielectric spacer liner 82. The first anisotropic etch process may have an etch chemistry that etches the third dielectric material selective to the second dielectric material. The photoresist layer 87 may be used as a patterned etch mask layer.

In one embodiment, the lithographic overlay variations between the pattern of the openings in the photoresist layer 87 and the pattern of the openings in the planar dielectric spacer liner 82 may be non-zero due to inherent limitations in the overlay control during the lithographic process that patterns the openings in the photoresist layer 87. Such lithographic overlay variations are controlled to be within an overlay tolerance range during the lithographic exposure process. However, aggressive device scaling in advanced semiconductor devices typically generate configurations in which the pattern of the opening in the photoresist layer 87, and thus, the pattern of the interconnect via cavities 91, may be off-centered relative to the pattern of the openings through the planar dielectric spacer liner 82. In one embodiment, the first anisotropic etch process may form an interconnect via cavity 91, or a plurality of interconnect via cavities 91, such that a first segment 91S1 of a sidewall of the interconnect via cavity 91 vertically extends to the recessed planar top surface of the etch stop dielectric liner 84 in a recess region (i.e., a top surface of a horizontal plate portion 84P), and a second segment 91S2 of the sidewall of the interconnect via cavity 91 vertically extends to topmost planar surface of the etch stop dielectric liner 84. Generally, the top surface of each horizontal plate portion 84P of the etch stop dielectric liner 84 may be partly or fully physically exposed at the bottom of a respective overlying interconnect via cavity 91. In some embodiments, a portion of the topmost surface of the etch stop dielectric liner 84 may be physically exposed at the bottom of one or more interconnect via cavities 91. In such embodiments in which a portion of the topmost surface of the etch stop dielectric liner 84 may be physically exposed at the bottom of one or more interconnect via cavities 91, a portion of the via-level dielectric layer 86 may remain in the horizontal plate portions 84P. This remaining via-level dielectric layer may be referred to as a via-level dielectric layer remainder 86R Referring to FIGS. 11A and 11B, a second anisotropic etch process may be performed to vertically extend the interconnect via cavities 91 through the etch stop dielectric liner 84. The second anisotropic etch process has an etch chemistry that etches the second dielectric material selective to the first dielectric material of the planar dielectric spacer liner 82, the dielectric material of the planarization dielectric layer 70, and the conductive material of the device contact via structures (74, 78). The second anisotropic etch process etches unmasked portions of the etch stop dielectric liner 84 selective to the first dielectric material of the planar dielectric spacer liner 82. In one embodiment, a stepped bottom surface may be formed at a bottom of one or more interconnect via cavities 91 after the second anisotropic etch process. In one embodiment, a horizontal top surface of a device contact via structure (74, 78), a top surface of the planarization dielectric layer 70, a sidewall of the planar dielectric spacer liner 82, a top surface of the planar dielectric spacer liner 82, and a sidewall of the etch stop dielectric liner 84 may be physically exposed around an interconnect via cavity 91, or around multiple interconnect via cavities 91. The photoresist layer 87 may be subsequently removed, for example, by ashing.

Figure 12A:
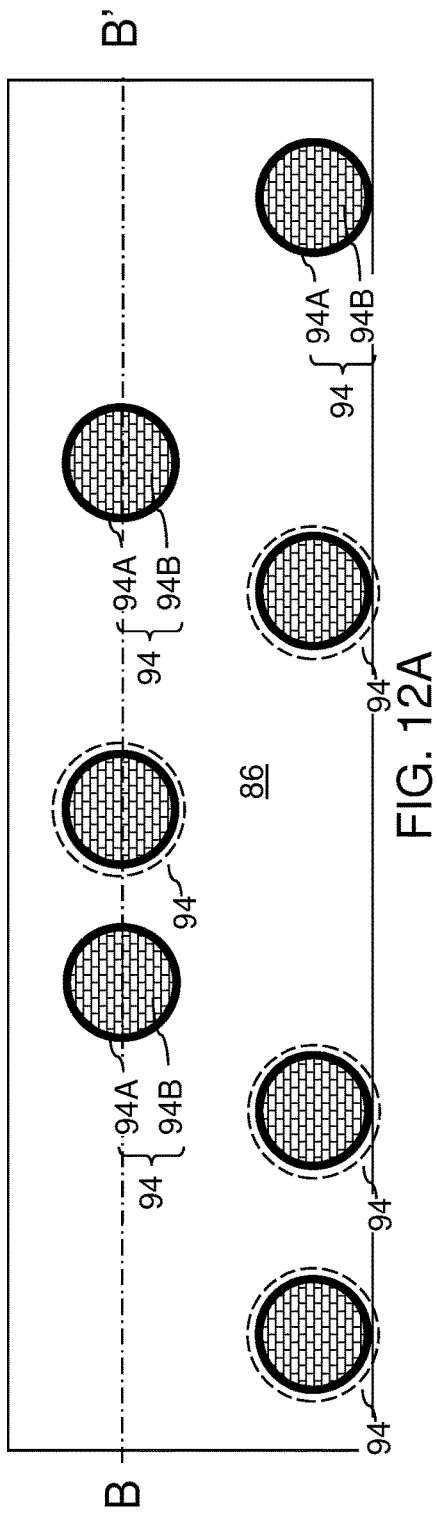
FIG. 12A is a top-down view of the exemplary structure after formation of interconnect via structures according to an embodiment of the present disclosure.
Figure 12B:
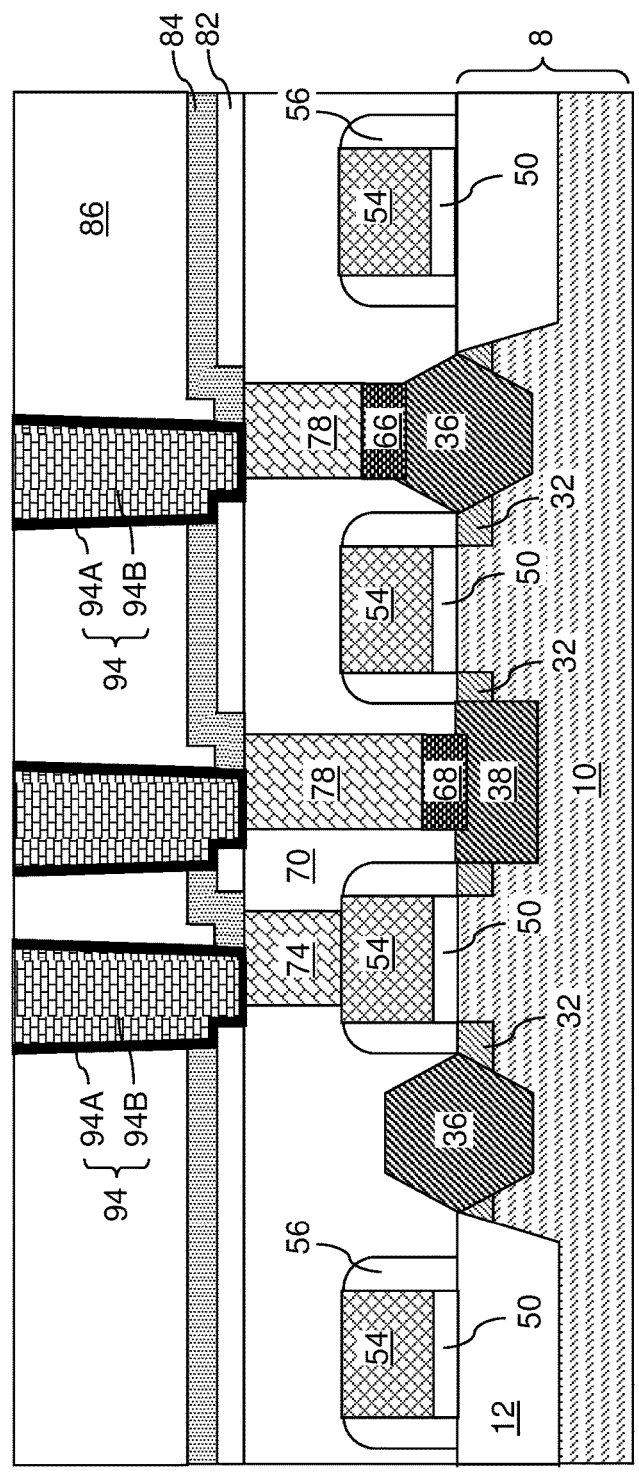
FIG. 12B is a vertical cross-sectional view of the exemplary structure along the plane B-B' of FIG. 12A.

Referring to FIGS. 12A and 12B, at least one conductive material may be deposited in the interconnect via cavities 91. In one embodiment, a metallic barrier material layer and a metallic fill material layer may be deposited in the interconnect via cavities 91, and excess portions of the metallic barrier material layer and the metallic fill material layer may be removed from above the horizontal plane including the top surface of the via-level dielectric layer 86. The metallic barrier material layer may include a conductive metallic nitride material such as TiN, TaN, and/or WN, and may be deposited by chemical vapor deposition or physical vapor deposition. Other suitable conductive barrier materials are within the contemplated scope of disclosure. The thickness of the metallic barrier material layer may be in a range from 3 nm to 30 nm, such as from 5 nm to 15 nm, although lesser and greater thicknesses may also be used. The metallic fill material layer includes a metal having high electrical conductivity such as Cu, Ru, Co, Mo, W, or a combination thereof. Other suitable metallic fill materials are within the contemplated scope of disclosure. The metallic fill material layer may be deposited by physical vapor deposition, chemical vapor deposition, electroplating, and/or electroless plating.

Removal of excess portions of the metallic barrier material layer and the metallic fill material layer from above the horizontal plane including the top surface of the via-level dielectric layer 86 may be effected by a chemical mechanical planarization process and/or a recess etch process. Each remaining portion of the metallic barrier material layer and the metallic fill material layer that fills an interconnect via cavity 91 comprises an interconnect via structure 94. Each interconnect via structure 94 contacts a respective underlying device contact via structure (74, 78), and functions as a vertical electrically conductive path. Each interconnect via structure 94 may include a metallic barrier layer 94A and a metallic fill material portion 94B. Each metallic barrier layer 94A is a patterned portion of the metallic barrier material layer, and the metallic fill material portion is a patterned portion of the metallic fill material layer. Each metallic fill material portion 94B is a patterned portion of the metallic fill material layer. Each contiguous combination of a metallic barrier layer 94A and a metallic fill material portion 94B constitutes an interconnect via structure 94.

Figure 13A:
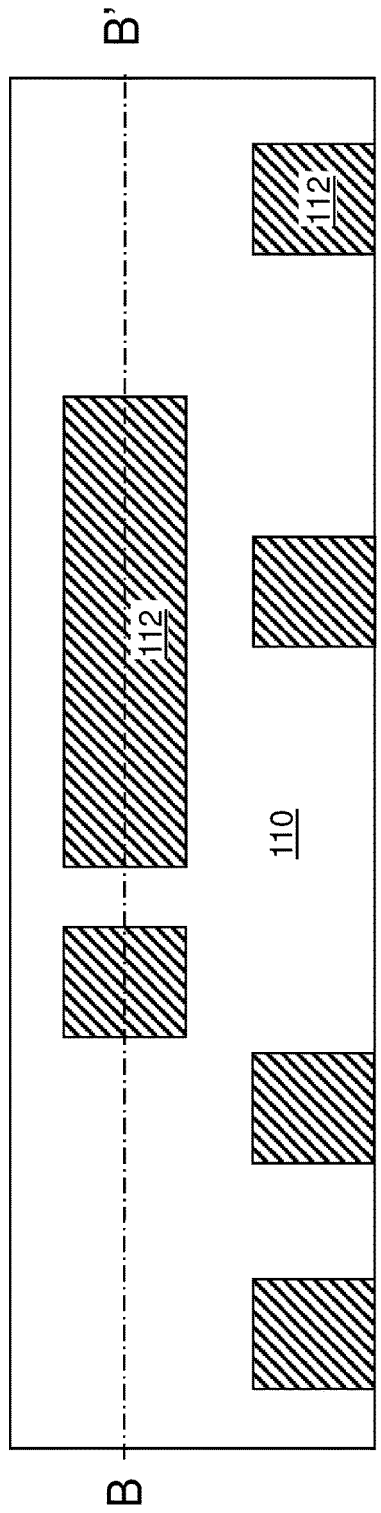
FIG. 13A is a top-down view of the exemplary structure after formation of metal lines according to an embodiment of the present disclosure.
Figure 13B:
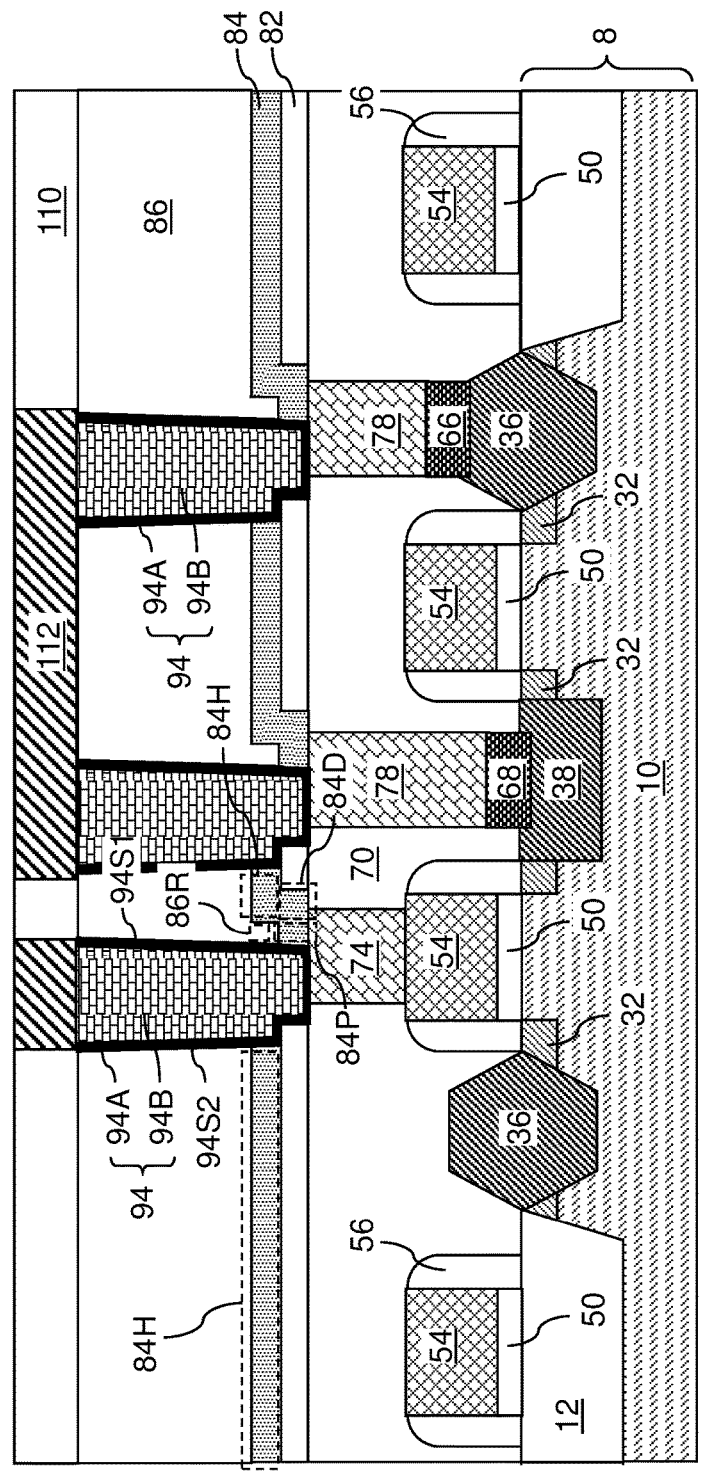
FIG. 13B is a vertical cross-sectional view of the exemplary structure along the plane B-B' of FIG. 13A.

Referring to FIGS. 13A and 13B, a line-level dielectric layer 110 may be deposited over the via-level dielectric layer 86. The line-level dielectric layer 110 may include any dielectric material that may be used for the via-level dielectric layer 86. The line-level dielectric layer 110 may be formed, for example, by chemical vapor deposition. The thickness of the line-level dielectric layer 110 may be in a range from 100 nm to 600 nm, such as from 150 nm to 300 nm, although lesser and greater thicknesses may also be used.

Cavities may be formed through the line-level dielectric layer 110 over each of the interconnect via structures 94. The cavities may include line cavities that laterally extend along a horizontal direction, and/or pad cavities overlying a respective interconnect via structure 94. At least one metallic material such as a combination of a metallic nitride liner material and a metallic fill material may be deposited in the cavities in the line-level dielectric layer 110. Excess portions of the at least one metallic material may be removed from above the horizontal plane including the top surface of the line-level dielectric layer 110. Remaining portions of the at least one conductive material filling the cavities in the line-level dielectric layer 110 comprise metal lines 112. Each metal line 112 may contact a top surface of at least one underlying interconnect via structure 94. Additional interlayer dielectric (ILD) layers and additional metal interconnect structures (such as metal via structures and metal line structures) may be formed above the line-level dielectric layer 110 as necessary.

Referring to FIGS. 1A-13B and according to various embodiments of the present disclosure, a device structure is provided, which comprises a semiconductor device (which may be a field effect transistor or any other semiconductor device) located on a semiconductor substrate (such as the substrate 8) and laterally surrounded by a planarization dielectric layer 70; a device contact via structure (74, 78) vertically extending through the planarization dielectric layer 70 and contacting a node of the semiconductor device; a planar dielectric spacer liner 82 contacting a top surface of the planarization dielectric layer 70 and including an opening therethrough; an etch stop dielectric liner 84 including a horizontally-extending portion 84H that overlies the planar dielectric spacer liner 82 and including a downward-protruding portion 84D located at a periphery of the opening through the planar dielectric spacer liner 82; a via-level dielectric layer 86 overlying the etch stop dielectric liner 84; and an interconnect via structure 94 vertically extending through the via-level dielectric layer 86, the etch stop dielectric liner 84, and the planar dielectric spacer liner 82 and contacting the device contact via structure (74, 78).

In one embodiment, the interconnect via structure 94 comprises a straight sidewall (94S1, 94S2) (which may, or may not, by a cylindrical sidewall); a first segment 94S1 of the straight sidewall vertically extends from a top surface of the via-level dielectric layer 86 to a top surface of the device contact via structure (74, 78); and a second segment 94S2 of the straight sidewall vertically extends from the top surface of the via-level dielectric layer 86 to a height located above a horizontal plane including the top surface of the device contact via structure (74, 78). In one embodiment, a bottom edge of the second segment 94S2 of the straight sidewall contacts the planar dielectric spacer liner 82.

In one embodiment, a bottom edge of the second segment 94S2 of the straight sidewall is adjoined to a horizontal surface of the interconnect via structure 94 that is vertically spaced from the horizontal plane including the top surface of the device contact via structure (74, 78), which is located at an interface with the bottom surface of the planar dielectric spacer liner 82 and a bottom surface of the downward-protruding portion 84D of the etch stop dielectric liner 84. In one embodiment, the horizontal surface of the interconnect via structure 94 contacts a horizontal surface of the planar dielectric spacer liner 82. In one embodiment, a bottommost horizontal surface of the interconnect via structure 94 contacts a top surface of the planarization dielectric layer 70.

In one embodiment, the etch stop dielectric liner 84 includes a horizontal plate portion 84P that adjoins the downward-protruding portion 84D and contacts a top surface of the device contact via structure (74, 78). In one embodiment, the via-level dielectric layer 86 comprises a downward-protruding portion 86R that extends below a horizontal plane including a topmost horizontal surface of the etch stop dielectric liner 84.

In one embodiment, the interconnect via structure 94 contacts a top surface of the device contact via structure (74, 78), a top surface of the planarization dielectric layer 70, a sidewall of the planar dielectric spacer liner 82, and at least one sidewall of the etch stop dielectric liner 84.

In one embodiment, each of the planarization dielectric layer 70 and the via-level dielectric layer 86 comprises a respective material selected from undoped silicate glass, a doped silicate glass, an organosilicate glass, and a porous dielectric material having a dielectric constant less than 2.7; the planar dielectric spacer liner 82 comprises a material selected from silicon oxide, silicon oxynitride, and silicon carbide nitride; and the etch stop dielectric liner 84 comprises a material selected from silicon nitride and a dielectric metal oxide.

Referring to FIGS. 14A and 14B, an alternative configuration of the exemplary structure according to an embodiment of the present disclosure is illustrated. The alternative configuration may be derived from the configuration illustrated in FIGS. 13A and 13B in embodiments in which the overlay error between the pattern of the openings in the planar dielectric spacer liner 82 and the pattern of the openings in the photoresist layer 87 at the processing steps of FIGS. 10A and 10B is zero, or is small enough such that the planar dielectric spacer liner 82 is not physically exposed to an interconnect via cavity 91 after the anisotropic etch process at the processing steps of FIGS. 11A and 11B.

The alternative configuration of the exemplary structure may include a device structure, which comprises a semiconductor device (which may be a field effect transistor or any other semiconductor device) located on a semiconductor substrate (such as the substrate 8) and laterally surrounded by a planarization dielectric layer 70; a device contact via structure (74, 78) vertically extending through the planarization dielectric layer 70 and contacting a node of the semiconductor device; a planar dielectric spacer liner 82 contacting a top surface of the planarization dielectric layer 70 and including an opening therethrough; an etch stop dielectric liner 84 including a horizontally-extending portion 84H that overlies the planar dielectric spacer liner 82 and including a downward-protruding portion 84D located at a periphery of the opening through the planar dielectric spacer liner 82; a via-level dielectric layer 86 overlying the etch stop dielectric liner 84; and an interconnect via structure 94 vertically extending through the via-level dielectric layer 86, contacting the etch stop dielectric liner 84 and the device contact via structure (74, 78), and laterally spaced from (and thus, does not contact) the planar dielectric spacer liner 82 (for example, by the downward-protruding portion 84D of the etch stop dielectric liner 84).

In one embodiment, the downward-protruding portion 84D of the etch stop dielectric liner 84 comprises a cylindrical outer sidewall that contacts an entirety of a cylindrical sidewall of the opening through the planar dielectric spacer liner 82. In one embodiment, the downward-protruding portion 84D of the etch stop dielectric liner 84 comprises an annular bottom surface that contacts an annular portion of a top surface of the device contact via structure (74, 78).

In one embodiment, the interconnect via structure 94 may have a stepped sidewall that includes a first vertically-extending segment that contacts the via-level dielectric layer 86 and a sidewall of the horizontally-extending portion 84H of the etch stop dielectric liner 84, an annular horizontal segment that contacts an annular top surface of the downward-protruding portion 84D of the etch stop dielectric liner 84, and a second vertically-extending segment that contacts a cylindrical inner sidewall of the downward-protruding portion 84D of the etch stop dielectric liner 84.

Figure 15:
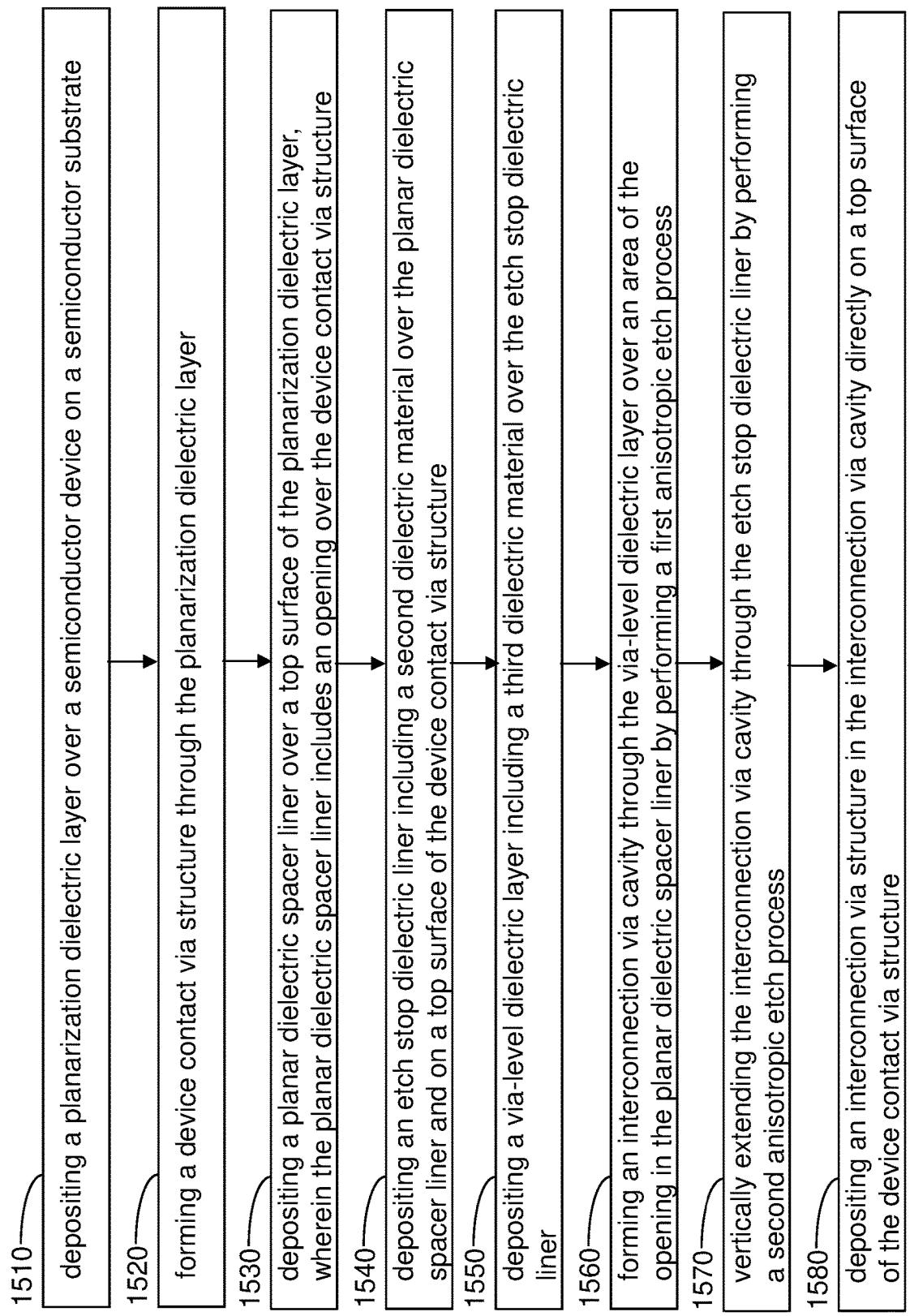
FIG. 15 is a flowchart illustrating steps for forming the exemplary structure of the present disclosure according to an embodiment of the present disclosure.

Referring to FIG. 15, a flowchart illustrates steps for forming the exemplary structure of the present disclosure according to an embodiment of the present disclosure. Referring to step 1510 and FIGS. 1A-3B, a planarization dielectric layer 70 may be deposited over a semiconductor device on a semiconductor substrate. Referring to step 1520 and FIGS. 3A-5B, a device contact via structure (74, 78) may be formed through the planarization dielectric layer 70. Referring to step 1530 and FIGS. 6A-7B, a planar dielectric spacer liner 82 including a first dielectric material may be deposited over a top surface of the planarization dielectric layer 70. The planar dielectric spacer liner 82 includes an opening over the device contact via structure (74, 78). Referring step 1540 and FIGS. 8A and 8B, an etch stop dielectric liner 84 including a second dielectric material may be deposited over the planar dielectric spacer liner 82 and on a top surface of the device contact via structure (74, 78). Referring to step 1550 and FIGS. 9A and 9B, a via-level dielectric layer 86 including a third dielectric material may be deposited over the etch stop dielectric liner 84. Referring to step 1560 and FIGS. 10A and 10B, an interconnect via cavity 91 may be formed through the via-level dielectric layer 86 over an area of the opening in the planar dielectric spacer liner 82 by performing a first anisotropic etch process that etches the third dielectric material selective to the second dielectric material using a patterned etch mask layer (such as a photoresist layer 87). Referring to step 1570 and FIGS. 11A and 11B, the interconnect via cavity 91 may be vertically extended through the etch stop dielectric liner 84 by performing a second anisotropic etch process that etches the second dielectric material selective to the first dielectric material. Referring to step 1580 and FIGS. 12A-14B, an interconnect via structure 94 may be deposited in the interconnect via cavity 91 directly on a top surface of the device contact via structure (74, 78).

The various embodiments of the present disclosure may be used to provide a device structure that is resistant to electrical shorts between neighboring clusters of device contact via structures (74, 78) and interconnect via structures 94. The lateral extent and the vertical extent of each interconnect via structure 94 is limited by the lateral extent and the vertical extent of openings as formed in the planar dielectric spacer liner 82 during the processing steps of FIGS. 7A and 7B. The etch process that defines the pattern of the opening in the planar dielectric spacer liner 82 etches only through the thickness of the planar dielectric spacer liner 82, thereby eliminating or reducing the overetch into the planarization dielectric layer 70. Further, the second anisotropic etch process that etches the unmasked portions of the etch stop dielectric liner 84 may be selective to the material of the planarization dielectric layer 70 and the material of the planar dielectric spacer liner 82, thereby eliminating or minimizing overetch during the second anisotropic etch process. Thus, electrical shorts between each interconnect via structure 94 and adjacent device contact via structures (74, 78) may be eliminated or minimized through the use of a two-step etching and tri-layered ILD.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device structure, comprising:
depositing a planarization dielectric layer over a semiconductor device on a semiconductor substrate;
forming a device contact via structure through the planarization dielectric layer;
depositing a planar dielectric spacer liner including a first dielectric material directly on an entirety of a top surface of the device contact via structure and directly on a top surface of the planarization dielectric layer;
forming an opening through the planar dielectric spacer liner by applying and patterning a photoresist layer over the planar dielectric spacer liner and by transferring a pattern in the photoresist layer through the planar dielectric spacer liner such that a bottom periphery of the opening is laterally offset outward relative to a periphery of the top surface of the device contact via structure;
depositing an etch stop dielectric liner including a second dielectric material over the planar dielectric spacer liner and on the entirety of the top surface of the device contact via structure and on an annular surface segment of the top surface of the planarization dielectric layer around the periphery of the top surface of the device contact via structure;

depositing a via-level dielectric layer including a third dielectric material over the etch stop dielectric liner;

forming an interconnect via cavity through the via-level dielectric layer over an area of the opening in the planar dielectric spacer liner by performing a first anisotropic etch process that etches the third dielectric material selective to the second dielectric material using a patterned etch mask layer;

vertically extending the interconnect via cavity through the etch stop dielectric liner by performing a second anisotropic etch process that etches the second dielectric material selective to the first dielectric material such that a first fraction of the annular surface segment of the top surface of the planarization dielectric layer is physically exposed and a second fraction of the annular surface segment of the top surface of the planarization dielectric layer is contacted by a remaining portion of the etch stop dielectric liner; and depositing an interconnect via structure in the interconnect via cavity directly on a first portion of the top surface of the device contact via structure and directly on the first fraction of the annular surface segment of the top surface of the planarization dielectric layer.

2. The method of claim 1, wherein the etch stop dielectric liner is deposited after removal of the photoresist layer on a top surface of the planar dielectric spacer liner, and on a sidewall of the opening through the planar dielectric spacer liner.

3. The method of claim 1, wherein the etch stop dielectric liner is deposited by a conformal deposition process, and comprises:
a horizontally-extending portion that is formed over the planar dielectric spacer liner;
a downward-protruding portion that is formed at a periphery of the opening in the planar dielectric spacer liner and adjoined to the horizontally-extending portion; and
a horizontal plate portion that adjoins the downward-protruding portion and is formed directly on the top surface of the device contact via structure.

4. The method of claim 1, wherein the etch stop dielectric liner comprises a recess region that overlies an area of the device contact via structure.

5. The method of claim 4, wherein a planar top surface of the etch stop dielectric liner in the recess region is vertically recessed relative to a horizontal plane including a topmost planar surface of the etch stop dielectric liner.

6. The method of claim 5, wherein the first anisotropic etch process forms the interconnect via cavity such that a first segment of a sidewall of the interconnect via cavity vertically extends to the planar top surface of the etch stop dielectric liner in the recess region, and a second segment of the sidewall of the interconnect via cavity vertically extends to topmost planar surface of the etch stop dielectric liner.

7. The method of claim 1, wherein the second anisotropic etch process etches the second dielectric material selective to a dielectric material of the planarization dielectric layer and selective to a material of the device contact via structure.

8. The method of claim 7, wherein a stepped bottom surface is formed at a bottom of the interconnect via cavity after the second anisotropic etch process.

9. The device structure of claim 1, wherein the etch stop dielectric liner includes a horizontal plate portion that adjoins the downward-protruding portion and contacts the top surface of the device contact via structure.

10. The method of claim 1, wherein the device contact via structure is formed by formation of a contact via cavity through the planarization dielectric layer, deposition of at least one metallic material in the contact via cavity, and by performing a planarization process that removes horizontally-extending portions of the at least one metallic material from above a horizontal plane including the top surface of the planarization dielectric layer.

11. The method of claim 1, wherein the semiconductor device comprises a field effect transistor, and the device contact via structure is formed on an electrical node of the field effect transistor.

12. A method of manufacturing a device structure, comprising:
forming a planarization dielectric layer over a semiconductor device on a semiconductor substrate;
forming a device contact via structure through the planarization dielectric layer;
forming a planar dielectric spacer liner including a first dielectric material directly on an entirety of a top surface of the device contact via structure and directly on a top surface of the planarization dielectric layer;
forming an opening through the planar dielectric spacer liner by applying and patterning a photoresist layer over the planar dielectric spacer liner and by transferring a pattern in the photoresist layer through the planar dielectric spacer liner such that a bottom periphery of the opening is laterally offset outward relative to a periphery of the top surface of the device contact via structure;
forming an etch stop dielectric liner including a second dielectric material over the planar dielectric spacer liner and on the entirety of the top surface of the device contact via structure and on an annular surface segment of the top surface of the planarization dielectric layer around the periphery of the top surface of the device contact via structure;
forming a via-level dielectric layer including a third dielectric material over the etch stop dielectric liner;
forming an interconnect via cavity through the via-level dielectric layer over an area of the opening in the planar dielectric spacer liner by performing a first anisotropic etch process that etches the third dielectric material selective to the second dielectric material using a patterned etch mask layer;
vertically extending the interconnect via cavity through the etch stop dielectric liner by performing a second anisotropic etch process that etches the second dielectric material selective to the first dielectric material such that a first fraction of the annular surface segment of the top surface of the planarization dielectric layer is physically exposed and a second fraction of the annular surface segment of the top surface of the planarization dielectric layer is contacted by a remaining portion of the etch stop dielectric liner; and
forming an interconnect via structure through the via-level dielectric layer, the etch stop dielectric liner, the planar dielectric spacer liner and directly on a first portion of the top surface of the device contact via structure and directly on the first fraction of the annular surface segment of the top surface of the planarization dielectric layer.

13. The method of claim 12, wherein the interconnect via cavity is formed over an area of the opening in the planar dielectric spacer liner.

14. The method of claim 13, wherein:
the interconnect via cavity comprises a stepped bottom surface after the second anisotropic etch process; and
the stepped bottom surface of the interconnect via cavity comprises a segment of a top surface of the planar dielectric spacer liner, a sidewall segment of an opening in the planar dielectric spacer liner, and a segment of the top surface of the device contact via structure.

15. The method of claim 10, wherein the etch stop dielectric liner is deposited by a conformal deposition process, and comprises:
a horizontally-extending portion that is formed over the planar dielectric spacer liner;
a downward-protruding portion that is formed at a periphery of the opening in the planar dielectric spacer liner and adjoined to the horizontally-extending portion; and
a horizontal plate portion that adjoins the downward-protruding portion and is formed directly top surface of the device contact via structure.

16. The method of claim 15, wherein:
a first region of the horizontally-extending portion, a first region of the downward-protruding portion, and a first region of the horizontal plate portion are replaced by the interconnect via structure; and
a second region of the horizontally-extending portion, a second region of the downward-protruding portion, and a second region of the horizontal plate portion remain after formation of the interconnect via structure.

17. A device structure comprising:
a semiconductor device located on a semiconductor substrate and laterally surrounded by a planarization dielectric layer;
a device contact via structure vertically extending through the planarization dielectric layer;
a planar dielectric spacer liner overlying the planarization dielectric layer and having an opening therethrough, wherein a bottom periphery of the opening is laterally offset outward relative to a periphery of a top surface of the device contact via structure by an annular surface segment of the top surface of the planarization dielectric layer;
an etch stop dielectric liner including a horizontally-extending portion that overlies the planar dielectric spacer liner and including a downward-protruding portion located at a periphery of an opening through the planar dielectric spacer liner;
a via-level dielectric layer overlying the etch stop dielectric liner; and
an interconnect via structure vertically extending through the via-level dielectric layer, the etch stop dielectric liner, and the planar dielectric spacer liner and contacting the device contact via structure,
wherein the interconnect via structure contacts a top surface of the device contact via structure and a first fraction of the annular surface segment of the top surface of the planarization dielectric layer, and a second fraction of the annular surface segment of the top surface of the planarization dielectric layer is contacted by the etch stop dielectric liner.

18. The device structure of claim 17, wherein the interconnect via structure comprises a stepped bottom surface including a first horizontal surface segment that contacts the top surface of the planarization dielectric layer and a second horizontal surface segment that contacts the top surface of the device contact via structure.

19. The device structure of claim 17, wherein the via-level dielectric layer comprises a downward-protruding portion that extends below a horizontal plane including a topmost horizontal surface of the etch stop dielectric liner, contacts the interconnect via structure, and overlies an opening in the planar dielectric spacer liner.

20. The device structure of claim 17, wherein:
the planar dielectric spacer liner consists of the first dielectric material; and
the first dielectric material is selected from silicon oxide, silicon oxynitride, and silicon carbide nitride.

* * * * *